(12) United States Patent
Bhattacharyya

(10) Patent No.: US 10,153,381 B1
(45) Date of Patent: Dec. 11, 2018

(54) MEMORY CELLS HAVING AN ACCESS GATE AND A CONTROL GATE AND DIELECTRIC STACKS ABOVE AND BELOW THE ACCESS GATE

(71) Applicant: Micron Technology, Inc., Boise, ID (US)

(72) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/641,521

(22) Filed: Jul. 5, 2017

(51) Int. Cl.
*H01L 29/76* (2006.01)
*H01L 29/792* (2006.01)
*H01L 27/1157* (2017.01)
*H01L 29/423* (2006.01)

(52) U.S. Cl.
CPC ...... *H01L 29/7923* (2013.01); *H01L 27/1157* (2013.01); *H01L 29/42344* (2013.01)

(58) Field of Classification Search
USPC .......................................................... 257/326
See application file for complete search history.

(56) References Cited

U.S. PATENT DOCUMENTS

| | | | |
|---|---|---|---|
| 4,870,470 A | 9/1989 | Bass et al. | |
| 6,388,293 B1 * | 5/2002 | Ogura | G11C 16/0466 257/324 |
| 6,743,681 B2 | 6/2004 | Bhattacharyya | |
| 6,743,682 B2 | 6/2004 | Woerlee et al. | |
| 6,888,200 B2 | 5/2005 | Bhattacharyya | |
| 6,903,969 B2 | 6/2005 | Bhattacharyya | |
| 6,917,078 B2 | 7/2005 | Bhattacharyya | |
| 6,998,667 B2 | 2/2006 | Bhattacharyya | |
| 7,012,297 B2 | 3/2006 | Bhattacharyya | |
| 7,042,027 B2 | 5/2006 | Bhattacharyya | |
| 7,130,216 B2 | 10/2006 | Bhattacharyya | |
| 7,145,186 B2 | 12/2006 | Bhattacharyya | |
| 7,158,410 B2 | 1/2007 | Bhattacharyya et al. | |
| 7,166,888 B2 | 1/2007 | Bhattacharyya | |
| 7,184,312 B2 | 2/2007 | Bhattacharyya | |
| 7,208,793 B2 | 4/2007 | Bhattacharyya | |
| 7,224,002 B2 | 5/2007 | Bhattacharyya | |
| 7,244,981 B2 | 7/2007 | Bhattacharyya | |
| 7,250,628 B2 | 7/2007 | Bhattacharyya | |

(Continued)

OTHER PUBLICATIONS

Aoyama et al., "Proposal of New HfSiON CMOS Fabrication Process (HAMDAMA) for Low Standby Power Device", IEEE International Electron Devices Meeting (IEDM) 2004, Dec. 13-15, 2004, San Francisco, CA, pp. 95-98.

(Continued)

*Primary Examiner* — Marc Armand
*Assistant Examiner* — Sue Tang
(74) *Attorney, Agent, or Firm* — Brooks, Cameron & Huebsch, PLLC

(57) ABSTRACT

In an example, a memory cell may have an access gate, a control gate coupled to the access gate, a first dielectric stack below an upper surface of a semiconductor, above the access gate, and between a first portion of the control gate and the semiconductor, and a second dielectric stack below the access gate and the first dielectric stack and between a second portion of the control gate and the semiconductor. Each of the first and second dielectric stacks may store a charge.

18 Claims, 6 Drawing Sheets

(56) References Cited

U.S. PATENT DOCUMENTS

| | | | |
|---|---|---|---|
| 7,273,784 B2 | 9/2007 | Bhattacharyya | |
| 7,276,760 B2 | 10/2007 | Bhattacharyya | |
| 7,279,740 B2 | 10/2007 | Bhattacharyya et al. | |
| 7,339,239 B2 | 3/2008 | Forbes | |
| 7,339,830 B2 | 3/2008 | Bhattacharyya | |
| 7,349,252 B2 | 3/2008 | Bhattacharyya et al. | |
| 7,365,388 B2 | 4/2008 | Bhattacharyya | |
| 7,379,336 B2 | 5/2008 | Bhattacharyya et al. | |
| 7,385,245 B2 | 6/2008 | Bhattacharyya | |
| 7,400,012 B2 | 7/2008 | Bhattacharyya | |
| 7,403,416 B2 | 7/2008 | Bhattacharyya et al. | |
| 7,417,893 B2 | 8/2008 | Bhattacharyya et al. | |
| 7,429,767 B2 | 9/2008 | Bhattacharyya | |
| 7,432,562 B2 | 10/2008 | Bhattacharyya | |
| 7,436,018 B2 | 10/2008 | Bhattacharyya | |
| 7,440,310 B2 | 10/2008 | Bhattacharyya | |
| 7,440,317 B2 | 10/2008 | Bhattacharyya | |
| 7,456,054 B2 | 11/2008 | Bhattacharyya | |
| 7,457,159 B2 | 11/2008 | Bhattacharyya et al. | |
| 7,459,740 B2 | 12/2008 | Bhattacharyya et al. | |
| 7,476,927 B2 | 1/2009 | Bhattacharyya | |
| 7,482,651 B2 | 1/2009 | Bhattacharyya | |
| 7,485,513 B2 | 2/2009 | Bhattacharyya | |
| 7,525,149 B2 | 4/2009 | Bhattacharyya et al. | |
| 7,528,043 B2 | 5/2009 | Bhattacharyya | |
| 7,544,990 B2 | 6/2009 | Bhattacharyya | |
| 7,553,735 B2 | 6/2009 | Bhattacharyya | |
| 7,579,242 B2 | 8/2009 | Bhattacharyya | |
| 7,612,403 B2 | 11/2009 | Bhattacharyya | |
| 7,625,803 B2 | 12/2009 | Bhattacharyya | |
| 7,629,641 B2 | 12/2009 | Bhattacharyya | |
| 7,662,693 B2 | 2/2010 | Bhattacharyya | |
| 7,671,407 B2 | 3/2010 | Bhattacharyya | |
| 7,728,350 B2 | 6/2010 | Bhattacharyya | |
| 7,749,848 B2 | 7/2010 | Bhattacharyya et al. | |
| 7,750,395 B2 | 7/2010 | Bhattacharyya | |
| 7,759,715 B2 | 7/2010 | Bhattacharyya | |
| 7,768,062 B2 | 8/2010 | Bhattacharyya et al. | |
| 7,786,516 B2 | 8/2010 | Bhattacharyya | |
| 7,838,362 B2 | 11/2010 | Bhattacharyya | |
| 7,851,827 B2 | 12/2010 | Bhattacharyya | |
| 7,867,850 B2 | 1/2011 | Bhattacharyya | |
| 7,898,022 B2 | 3/2011 | Bhattacharyya | |
| 7,956,426 B2 | 6/2011 | Bhattacharyya | |
| 7,964,909 B2 | 6/2011 | Bhattacharyya | |
| 7,968,402 B2 | 6/2011 | Bhattacharyya | |
| 8,058,118 B2 | 11/2011 | Bhattacharyya | |
| 8,063,436 B2 | 11/2011 | Bhattacharyya | |
| 8,125,003 B2 | 2/2012 | Bhattacharyya | |
| 8,143,657 B2 | 3/2012 | Bhattacharyya | |
| 8,159,875 B2 | 4/2012 | Bhattacharyya | |
| 8,193,568 B2 | 6/2012 | Bhattacharyya | |
| 8,228,743 B2 | 7/2012 | Min et al. | |
| 8,242,554 B2 | 8/2012 | Bhattacharyya | |
| 2006/0202251 A1* | 9/2006 | Bhattacharyya | H01L 27/115 257/314 |
| 2007/0034922 A1 | 2/2007 | Bhattacharyya | |
| 2008/0253183 A1* | 10/2008 | Mizukami | H01L 27/105 365/185.05 |
| 2008/0303080 A1 | 12/2008 | Bhattacharyya | |
| 2010/0090265 A1 | 4/2010 | Bhattacharyya et al. | |
| 2010/0221905 A1* | 9/2010 | Hautala | H01L 21/28273 438/591 |
| 2015/0060991 A1* | 3/2015 | Mizutani | H01L 29/792 257/324 |
| 2015/0371998 A1* | 12/2015 | Lue | H01L 27/11563 257/326 |

OTHER PUBLICATIONS

Cho et al., "Observation of Single Electron Tunneling and Ballistic Transport in Twin Silicon Nanowire MOSFETs (TSNWFETs) Fabricated by Top-Down CMOS Process", IEEE International Electron Devices Meeting (IEDM) 2006, Dec. 11-13, 2006, San Francisco, CA, 4 pages.

Buchanan et al., 80 nm polysilicon gated n-FETs with ultra-thin Al2O3 gate dielectric for ULSI applications, IEEE International Electron Devices Meeting (IEDM) 2000, Dec. 10-13, 2000, San Francisco, CA, pp. 223-226.

Buckley et al., "In-depth Investigation of Hf-based High-k Dielectrics as Storage Layer of Charge Trap NVMs", IEEE International Electron Devices Meeting (IEDM) 2006, Dec. 11-13, 2006, San Francisco, CA, pp. 251-254.

Choi et al., "High Speed Flash Memory and 1T-DRAM on Dopant Segregated Schottky Barrier (DSSB) FinFET SONOS Device for Multi-functional SoC Applications", IEEE International Electron Devices Meeting (IEDM) 2008, Dec. 15-17, 2008, San Francisco, CA, 4 pages.

Dillon et al., "Hybrid Memory combining SRAM and NOR Flash for Code and Data Storage", Flash Memory Summit 2012, Aug. 7-9, 2012, Santa Clara, CA, 18 pages.

Han et al., "A Unified-RAM (DRAM) Cell for Multi-Functioning Capacitorless DRAM and NVM", IEEE International Electron Devices Meeting (IEDM) 2007, Dec. 10-12, 2007, Washington D.C., pp. 929-932.

Huang et al., "45nm High-K Metal Gate CMOS Technology for GPU/NPU Applications with Highest PFET Performance", IEEE International Electron Devices Meeting (IEDM) 2007, Dec. 10-12, 2007, Washington D.C., pp. 285-288.

Jung et al., "Three-Dimensionally Stacked Nand Flash Memory Technology Using Stacking Single Crystal Si Layers on ILD and Tanos Structure for Beyond 30nm Node", IEEE International Electron Devices Meeting (IEDM) 2006, Dec. 11-13, 2006, San Francisco, CA, pp. 37-40.

Kim et al., "Systematic Study of Workfunction Engineering and Scavenging Effect Using NiSi Alloy FUSI Metal Gates with Advanced Gate Stacks", IEEE International Electron Devices Meeting (IEDM) 2005, Dec. 5-7, 2005, Washington D.C., pp. 657-660.

Kim et al., "Robust Multi-bit Programmable Flash Memory Using a Resonant Tunnel Barrier", IEEE International Electron Devices Meeting (IEDM) 2005, Dec. 5-7, 2005, Washington D.C., pp. 881-884.

Krishnan et al., "A Manufacturable Dual Channel (Si and SiGe) High-K Metal Gate CMOS Technology with Multiple Oxides for High Performance and Low Power Applications", IEEE International Electron Devices Meeting (IEDM) 2011, Dec. 5-7, 2011, Washington, D.C., pp. 634-637.

Kubicek et al., "Low Vt CMOS Using Doped Hf-based Oxides, TaC-based Metals and Laser-only Anneal", IEEE International Electron Devices Meeting (IEDM) 2007, Dec. 10-12, 2007, Washington D.C., pp. 49-52.

Lai et al., "A Multi-Layer Stackable Thin-Film Transistor (TFT) NAND-Type Flash Memory", IEEE International Electron Devices Meeting (IEDM) 2006, Dec. 11-13, 2006, San Francisco, CA, 4 pages.

Lauwers et al., "CMOS Integration of Dual Work Function Phase Controlled NI FUSI with Simultaneous Silicidation of NMOS (NiSi) and PMOS (Ni-rich silicide) Gates on HfSiON", IEEE International Electron Devices Meeting (IEDM) 2005, Dec. 5-7, 2005, Washington, D.C., pp. 661-664.

Lee et al., Effect of Polysilicon Gate on the Flatband Voltage Shift and Mobility Degradation for ALD-Al2O3 Gate Dielectric, IEEE International Electron Devices Meeting (IEDM) 2000, Dec. 10-13, 2000, San Francisco, CA, pp. 545-648.

Lue et al., "A Novel P-Channel NAND-type Flash Memory with 2 bit/cell Operation and High Programming Throughput (>20 Mb/sec)", IEEE International Electron Devices Meeting (IEDM) 2005, Dec. 5-7, 2005, Washington, D.C., 4 pages.

Lue et al., "Scaling Feasibility of Planar Thin Floating Gate (FG) NAND Flash Devices and Size Effect Challenges beyond 20nm", IEEE International Electron Devices Meeting (IEDM) 2011, Dec. 5-7, 2011, Washington, D.C., pp. 203-206.

Luo et al., "Design of High Performance PFETs with Strained Si Channel and Laser Anneal", IEEE International Electron Devices Meeting (IEDM) 2005, Dec. 5-7, 2005, Washington D.C., pp. 495-498.

(56) References Cited

OTHER PUBLICATIONS

Manchanda et al., "Gate Quality Doped High K films for CMOS beyond 100 nm: 3-10nm Al2O3 with Low Leakage and Low Interface States", IEEE International Electron Devices Meeting (IEDM) 1998, Dec. 6-9, 1998, San Francisco, CA, pp. 605-608.

Manchanda et al., "Si-Doped Aluminates for High Temperature Metal-Gate CMOS: Zr—AlSi—O, a Novel Gate Dielectric for Low Power Applications", IEEE International Electron Devices Meeting (IEDM) 2000, Dec. 10-13, 2000, San Francisco, CA, pp. 23-26.

Mayuzumi et al., "Extreme High Performance n- and p-MOSFETs Boosted by Dual-Metal/High-k Gate Damascene Process using Top-Cut Dual Stress Liners on (100) Substrates" IEEE International Electron Devices Meeting (IEDM) 2007, Dec. 10-12, 2007, Washington D.C., pp. 293-296.

Moon et al., "Multi-Functional Universal Device using a Band-Engineered Vertical Structure", IEEE International Electron Devices Meeting (IEDM) 2011, Dec. 5-7, 2011, Washington D.C., pp. 551-554.

Nemati et al., "A Novel Thyristor-based SRAM Cell (T-RAM) for High-Speed, Low-Voltage, Giga-scale Memories", IEEE International Electron Devices Meeting (IEDM) 1999, Dec. 5-8, 1999, Washington D.C., pp. 283-286.

Oh et al., "4-bit Double Sonos Memories (DSMs) Using Single-Level and Multi-Level Cell Schemes", IEEE International Electron Devices Meeting (IEDM) 2006, Dec. 11-13, 2006, San Francisco, CA, pp. 967-970.

Ohba et al., "35 nm Floating Gate Planar MOSFET Memory using Double Junction Tunneling", IEEE International Electron Devices Meeting (IEDM) 2005, Dec. 5-7, 2005, Washington D.C., 4 pages.

Ohba et al., "25 nm Planar Bulk SONOS-type Memory with Double Tunnel Junction", IEEE International Electron Devices Meeting (IEDM) 2006, Dec. 11-13, 2006, San Francisco, CA, pp. 959-962.

Ohta et al., "High performance Sub-40 nm Bulk CMOS with Dopant Confinement Layer (DCL) Techniques as a Strain Booster", IEEE International Electron Devices Meeting (IEDM) 2007, Dec. 10-12, 2007, Washington D.C., pp. 289-292.

Ranica et al., "A new 40-nm SONOS Structure Based on Backside Trapping for Nanoscale Memories", IEEE Transactions on Nanotechnology, vol. 4, Issue No. 5, Sep. 2005, pp. 581-587.

Sarkar et al., "Dual Floating Gate Unified Memory MOSFET With Simultaneous Dynamic and Non-Volatile Operation", IEEE Electron Device Letters, vol. 35, Issue No. 1, Jan. 2014, pp. 48-50.

Taguchi, "NOR Flash Memory Technology", presented at 2006 IEEE International Electron Devices Meeting (IEDM) Short Course on Memory Technologies for 45nm and Beyond, Dec. 2006, 27 pages.

Wang et al., "Fast Erasing and Highly Reliable MONOS Type Memory with HfO2 High-k Trapping Layer and Si3N4/SiO2 Tunneling Stack", IEEE International Electron Devices Meeting (IEDM) 2006, Dec. 11-13, 2006, San Francisco, CA, pp. 971-974.

Whang et al., "Novel 3D Dual Control-Gate with Surrounding Floating-Gate (DC-SF) NAND Flash Cell for 1Tb File Storage Application", IEEE International Electron Devices Meeting (IEDM) 2010, Dec. 6-8, 2010, San Francisco, CA, pp. 668-671.

Yu et al., "Advanced MOSFETs Using HfTaON/SiO2 Gate Dielectric and TaN Metal Gate with Excellent Performance for Low Standby Power Applications", IEEE International Electron Devices Meeting (IEDM) 2005, Dec. 5-7, 2005, Washington, D.C., pp. 31-34.

Zhang et al., Novel ZrO2/Si3N4 Dual Charge Storage Layer to Form Step-up Potential Wells for Highly Reliable Multi-level Cell Application, IEEE International Electron Devices Meeting (IEDM) 2007, Dec. 10-12, 2005, Washington D.C., pp. 83-86.

Likharev, "Riding the Crest of a New Wave in Memory", IEEE Circuits and Devices Magazine, vol. 16, Issue 4, Jul. 2000, pp. 16-21.

Ramaswamy et al., "Engineering a Planar NAND Cell Scalable to 20nm and Beyond", 2013 5th IEEE Memory Workshop, May 26-29, 2013, Monterey, CA, pp. 5-8.

Hubert et al., "A Stacked SONOS Technology, Up to 4 Levels and 6nm Crystalline Nanowires, with Gate-All-Around or Independent Gates (φ-Flash), Suitable for Full 3D Integration", IEEE International Electron Devices Meeting (IEDM) 2009, Dec. 7-9, 2009, Baltimore, MD, 4 pages.

\* cited by examiner

US 10,153,381 B1

MEMORY CELLS HAVING AN ACCESS GATE AND A CONTROL GATE AND DIELECTRIC STACKS ABOVE AND BELOW THE ACCESS GATE

TECHNICAL FIELD

The present disclosure relates generally to memory cells, and, more particularly, to memory cells having an access gate and a control gate and dielectric stacks above and below the access gate.

BACKGROUND

Memory is sometimes implemented in electronic systems, such as computers, cell phones, hand-held devices, etc. There are many different types of memory, including volatile and non-volatile memory. Volatile memory may require power to maintain its data and may include random access memory (RAM), dynamic random-access memory (DRAM), static random access memory (SRAM), and synchronous dynamic random access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), or the like. Hard disc drives (HDDs) may be an example of another type of memory and may include magnetic tapes and/or optical discs.

Some electronic systems may include a processor (e.g., for controlling the electronic system). For example, some processors may include SRAM. In some examples, a processor may include a cache memory that may be an SRAM or a DRAM.

The processor may be coupled to data storage devices, such as solid-state-data-storage devices (e.g., sometimes called solid-state drives (SSDs)) and/or hard disc drives. For example, a solid-state-data-storage device might include NAND flash memory, NOR flash memory, and/or NROM.

DETAILED DESCRIPTION

Figure 1:
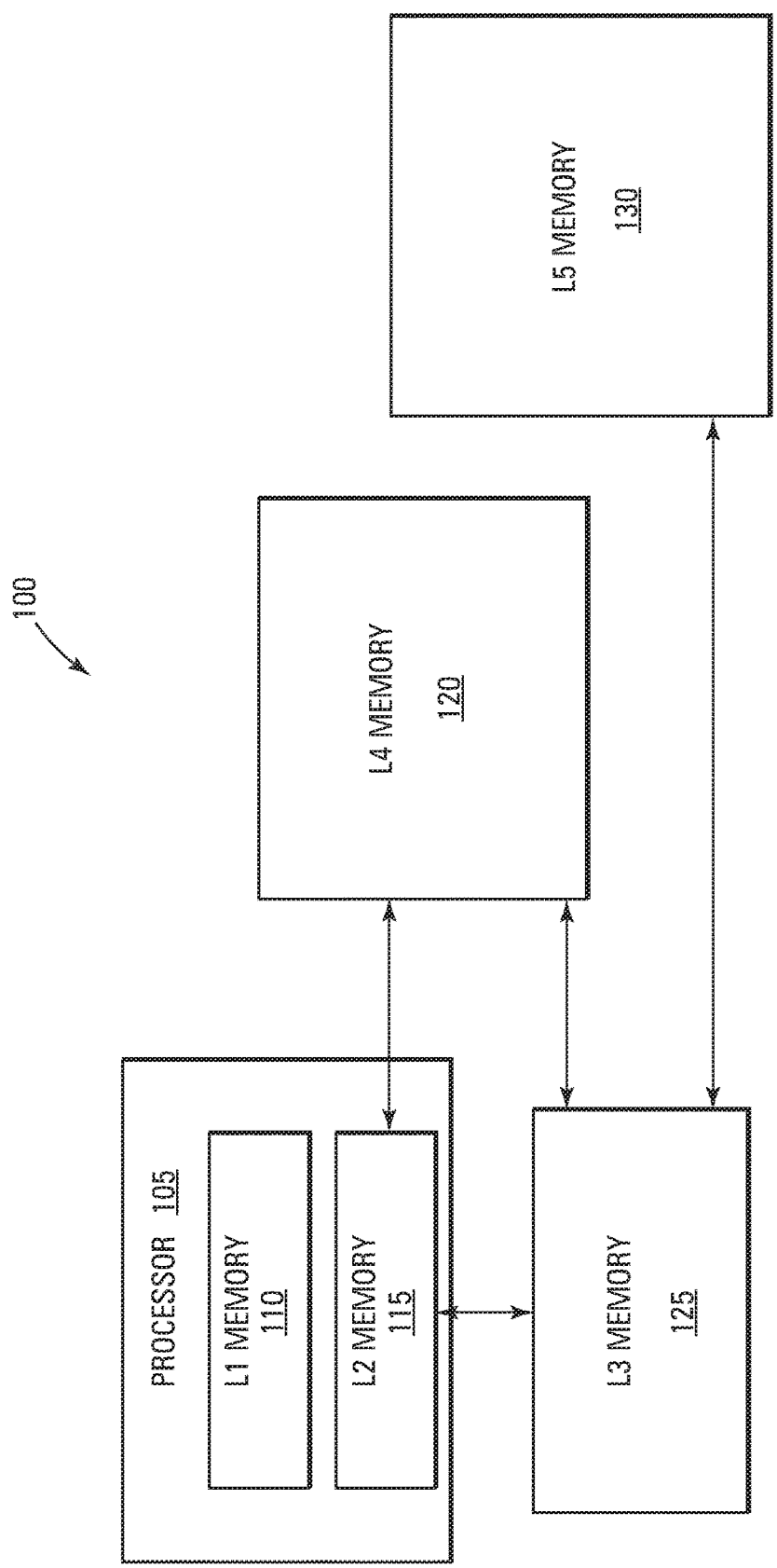
FIG. 1 is a block diagram that illustrates an example of an apparatus in accordance with a number of embodiments of the present disclosure.

In an example, a memory cell may have an access gate, a control gate coupled to the access gate, a first dielectric stack below an upper surface of a semiconductor, above the access gate, and between a first portion of the control gate and the semiconductor, and a second dielectric stack below the access gate and the first dielectric stack and between a second portion of the control gate and the semiconductor. Each of the first and second dielectric stacks of the control gate may store a charge.

In some examples, the memory cell above may be a non-volatile memory cell that may be an integrated form of a two-transistor version of a non-volatile memory cell. For example, a two-transistor non-volatile memory cell may include a fixed-threshold-voltage (e.g., to within routine variations of the threshold voltage) element, such as a fixed-threshold-voltage field-effect transistor (FET), that may be called an access device in series with a variable-threshold-voltage element (e.g., a variable-threshold-voltage FET) that may have a gate stack design for charge storage. Such an integrated device, for example, may be called a split-gate non-volatile memory cell (e.g., a split-channel non-volatile memory cell). In some examples, the non-volatile memory field-effect characteristics may operate due to the combined action of the access gate of the fixed-threshold-voltage element being in series with the control gate of the variable-threshold-voltage element control gate, where the combined fixed-threshold-voltage and variable-threshold-voltage elements define channel characteristics for the memory cell.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof. It should be noted, for example, that although some of the examples herein may be discussed in the framework of split-gate structures, the stack designs to be detailed herein may be applicable for single-transistor and two-transistor memory cells.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a block diagram that illustrates an example of an apparatus in the form of an electronic system 100 in accordance with a number of embodiments of the present disclosure. System 100 can be, for example, a computer system, a memory system, a hand-held device, a cell phone, etc. FIG. 1 illustrates an example of a memory hierarchy associated with electronic system 100. In this example, the memory hierarchy may include levels L1 to L5. As an example, levels L1 to L5 may be defined by memory characteristics (e.g., access speed, and or cycle speed, and or the data throughput, memory cell size, reliability, endurance, volatility, memory-window size, etc.). For example, in going from level L1 to level L5, the access speed, and the cycle speed, and the data throughput may progressively decrease, while the nonvolatility and storage capacity of the memory type may increase.

Note that the data access speed, for example, may be related to the read access time of the memory that implies the time it takes to ensure the binary ("1" or "0") state of any particular memory bit within a memory array (e.g., the higher the access speed, the lower the access time). For example, the cycle time may imply the time it takes to not only establish the binary memory state of any storage bit (either 1, or 0) through programming ("write" and or "erase") of the specific bit within the memory array, but also the time to ensure the memory state which is the access time. Memory delay (e.g., memory latency) may imply the time it takes for the memory bit to arrive at the processor node once the processor fetches the memory bit triggered by a unit of a clock cycle of the processor, for example. Memory bandwidth (e.g., memory throughput), for example, may be related and inversely proportional to the memory latency. The higher the memory bandwidth, for example, the lower the delay and lower the memory cycle time. For example, the data throughput may be inversely related to the data cycle time combined with the data transfer time to the processor, where the data transfer time to the processor may be dependent on the design of the memory output system and the transfer mode. Therefore, when memory with lower latency (e.g., a lower cycle time) may be employed, for example, the processor may execute an assigned task (e.g. any specific function or program) faster and the performance of a system (e.g., digital system) may be improved.

Memory volatility may be related to two aspects of retention of the memory state of any memory bit. One aspect of retention may be the retention of a memory state when the power is available to the memory array, implying that no re-writing (e.g., refreshing), such as re-establishing, the memory state is required during a time period. This aspect of retention may be longer for SRAM and shorter (in the order of milliseconds) for DRAM. Therefore, DRAM may require frequent refreshing of a memory state even when the power is on for the memory array. The other aspect of memory retention, for example, may be the ability to retain a written (e.g., established) memory state of any bit when there is no power to the memory array. Memory state retention of this type might be about 10 years for some nonvolatile memories of some SSDs (NROMs or NAND types of memory cells) and HDDs (magnetic tapes or disks).

When power is not available, for example, the memory states of SRAMs and DRAMs may be lost. Therefore, these types of memories may be classified as volatile memories. For non-volatile memories, for example, the lower the degree of volatility, the longer the memory retains data, and thus the greater the retention. For example, SDDs may, in general, be less nonvolatile compared to HDDs, where HDDs could retain data for centuries in properly stored environment. Silicon-based non-volatile memories may vary significantly in memory retention, depending on the memory type (NROM or NAND Flash), the memory cell attributes, and the detailed stack structure of the memory cell design. Some memory cell designs of NROMs and NAND, for example, may have at least one year of nonvolatility for most of the applications for which such memories are employed.

Another important property of memory, for example, may be the number of times memory binary states may be "written" or altered or "programmed" during the life time of the electronic system. In some examples, systems, such as memory systems, may be assumed to last for about 10 years, during which some memory bits may be altered for as many as million trillion times (1E15 times). The SRAMs and DRAMs, might, for example, withstand such re-programming known as "endurance." Endurance limits of some NROMs, for example, may be about 10 million times, while those of some NAND flash memories may be about 100,000 times to about one million times. This may limit the application of current NROMs and NANDs for L1, L2, and L3 memory applications, besides their significantly slower cycle time compared to SRAMs and DRAMs.

Electronic system 100 may include a processor 105, such as a microprocessor, that may control electronic system 100. Processor 105 may include a memory 110, such as a logic memory, having a memory level L1. For example, a conventional L1-level memory may be an SRAM volatile memory. Processor 105 may also include a memory 115, such as a cache memory, that may have a memory level L2, for example. An example of a conventional L2-level memory may be an SRAM volatile cache memory.

Advantages of SRAM may include, for example, high performance (e.g., high data throughput), and high endurance required for L1/L2-level functionality, and ease of fabrication (e.g., that may be compatible with complementary-metal-oxide-semiconductor (CMOS) fabrication techniques). Disadvantages of SRAM may include, limiting memory capacity, due, for example, to relatively large memory cell sizes (e.g., with a form factor F×F of about 50 to about 80) and volatility.

Memory 115 may be coupled to a memory 120, as shown in FIG. 1. Memory 115 may also be coupled to a memory 125, and memory 125 may be coupled to memory 120, for example. The term "coupled" may include directly coupled and/or directly connected with no intervening elements (e.g., by direct physical contact) or indirectly coupled and/or connected with intervening elements.

Memory 125 may be a main memory (e.g., a working memory) and may have a memory level L3. An example of a conventional L3-level memory may be a DRAM volatile memory. Advantages of DRAM, for example, may include relatively higher performance compared to non-volatile memories (e.g., read, write, and erase times of less than about 10 nanoseconds), relatively small (e.g., an F×F of about 6 to about 8) one-transistor-one-capacitor memory cells, yielding higher capacity, and relatively higher performance with lower cycle time to provide L3-level functionality. DRAM, for example, may provide relatively high endurance at the expense of power consumption for frequent refreshing of the memory states. Disadvantages of DRAM may include, for example, fabrication (e.g., customized CMOS fabrication for the capacitor may be required), scalability (e.g., may be difficult to scale to below 30 nanometers), and volatile memory cells (e.g., data may need to be refreshed about every millisecond).

Memory 120 may be a storage memory (e.g., for storing data and/or code) and may have a memory level L4. Examples of L4-level memory may include non-volatile NOR memory, non-volatile NAND memory, and non-volatile NROM. In some examples, memory 120 may be referred to as a solid-state memory.

Advantages of NROM (e.g., NROM flash) may include, for example, relatively high read performance (e.g., fast reads), non-volatile memory cells, relatively small (e.g., an F×F of about 6) random-access-one-transistor memory cells, multiple-bit-per cell storage capability, basic-input/output-system (BIOS) functionality, code storage capability, and fabrication (e.g., compatible with CMOS fabrication techniques). Disadvantages of NROM may include, for example, relatively slow writes, relatively high programming voltages, relatively low read/write endurance, and relatively poor durability.

Advantages of NAND (e.g., NAND flash) may include, for example, small (e.g., an F×F of about 4) one-transistor memory cells with single-bit- and multiple-bit-per cell storage capability, non-volatile memory cells, and high storage capacity per $mm^2$ of silicon. Disadvantages of NAND may include, for example, relatively slow write speeds (e.g., about 1.0 to about 10 millisecond), relatively slow access (e.g., serial/parallel memory access), and relatively low write/erase (W/E) endurance (e.g., about $10^3$ to about $10^5$ W/E cycles).

Memory 125 may be coupled a memory 130, having a memory level L5, for example. Examples of conventional L5-level memories may include magnetic memory (e.g., magnetic tapes) and/or optical memory (e.g., optical discs) for storing data. In some examples, memory 130 may be referred to as an HDD memory. Advantages of magnetic memory may include, for example, non-volatility, high-density storage, low cost, high capacity, and L5-level functionality. Disadvantages of magnetic memory may include, for example, speed (e.g., long access and cycle times), relatively poor reliability, and moving mechanical parts.

A memory hierarchy, such as that described above, may advantageously employ, for example, the memories described above, such as the L1- to L5-level memories (e.g., SRAM, DRAM, NROM, NAND, and HDD) to fulfill system functionality objectives with cost, capability, power, performance, form-factor, portability, and applications in mind. The hierarchy may require communication between various memories and, therefore, for example, may disadvantageously involve a significant amount of peripheral logic, power, cost, performance compromises, form-factor constraints, reliability issues, and durability issues. This, for example, may suggest a "one-type-fits-all" approach to memory design (e.g., a novel one-type-fits-all memory). Except for HDD, some processors and memories may (e.g., all) be silicon based, and the memory cell structure may (e.g., all) be similar and may be built using scaled CMOS field-effect transistor technology, for example.

There may be a need for memories that might include silicon-based-non-volatile-one-transistor memory cells that may satisfy the speed, power, and/or capacity requirements of L1-, L2-, L3-, L4-, and L5-level memories. For example, there may be a need for one type of memory cell that may satisfy the speed, power, and/or capacity requirements of L1-, L2-, L3-, L4-, and L5-level memories. There may be a need, for example, for unified technology integration with CMOS logic, such as unified fabrication techniques (e.g., that may be compatible with CMOS fabrication techniques). There may be a need, for example, for scalable and lower-power memories (e.g., memory cells) with higher reliability and durability. There may be a need for all memories to maintain the information or data when there is a loss of power. There may be a need, for example, to do away with the conventional memory hierarchy (e.g., in favor of a non-hierarchical organization) that may result in faster communication with the processor.

Conventional memory requirements and selection, in general, may be based on application, capacity, and power requirements, cost, portability, form factor, and system performance/execution requirements. Some memory parameters, for example, may be cost, form factor, package density, and power consumption. Another parameter in selecting specific memory types and organizing memory use in a specific system, such as electronic system 100, may be data throughput, such as cycle time. For example, data throughput may depend on the intrinsic characteristics of the memory cell.

Cycle time, as mentioned earlier, may strongly impact the time it may take for the processor to fetch a specific bit of data from a specific memory array. Examples of estimated cycle times may include, for example, about 0.5 nanosecond to about 1.0 nanosecond for SRAM, about 5.0 nanoseconds to about 20 nanoseconds for DRAM, about 500 nanoseconds to about 1000 nanoseconds for NROM, and greater than about 10000 nanoseconds for NAND.

The present disclosure includes memory that may include, for example, non-volatile memory cells in which an active element, such as a field-effect transistor, may be integrated with a dielectric stack, that can store a charge. In some examples, such a memory might be referred to as silicon-based-unified memory (SUM), such as uni-functional SUM (USUM). In some examples, the design of the dielectric stack may be varied so that the non-volatile memory cell (e.g., a USUM memory cell) may operate as an L1-, L2-, L3-, L4-, or L5-level memory cell. For example, the memory cells disclosed herein may have higher performance, lower power consumption, and higher reliability than, for example, than some conventional NVM cells.

In some examples, field-effect-transistor- (e.g., FET-) based USUM devices may be designed to achieve different functionality, dependent on intrinsic dielectric stack characteristics of a design, by adding or subtracting dielectrics in the dielectric stack. USUM technology may be integrated with the CMOS logic technology, for example, unlike conventional memories, such as DRAM, that may have unique customized integration requirements. USUMs may be differentiated by the attributes of their charge transport, charge storage, and charge retention (e.g., charge blocking) characteristics. For example, the intrinsic memory-cell attributes may be different in terms of programming speed, power, and refresh requirements that may result in cycle-time variations, variations in data throughput and system capability, and differing applicability to replace conventional memories by functionality.

In some examples, some USUMs may have a programming voltage of about 5.0 volts to about 7.5 volts (e.g., compared to about 12 volts or higher for some NROMs and NANDs) and a programming speed of less than about 100 microseconds for two bits per memory cell (e.g., compared to about 1.0 millisecond for one bit per cell for some NROMs). Some USUMs may have an energy consumption of about 50 times less than some NROMs, for example.

Some DRAMs may operate at 1.5 volts and may need to be refreshed about every 10 milliseconds, for example. However, some USUMs, for example, may need to be reprogrammed every 10 seconds. Some DRAM memory cells, for example, may require twice as much area as some USUMs In various examples, SUM-memory-cell fabrication is compatible with complementary-metal-oxide-semiconductor (CMOS) fabrication techniques. This may allow, for example, the dielectric stack to be fabricated to a desired memory level (L1, L2, L3, L4, or L5) with a minimal number of additional processing steps. Moreover, the SUM memory cells may be scalable to about a five-nanometer feature size. For example, such scaling may be difficult for conventional DRAM designs.

USUM memory cells may be implemented (e.g., in scaled silicon) using, for example, CMOS logic technology and a set of unified and complimentary integration schemes that may eliminate some separate, custom-integration technology practices, such as those currently employed for DRAM (e.g., for L3), and NROM (for code, BIOS, etc.) and NAND-Flash ((e.g., for L4) memory chips. USUM memory cell technology may (e.g., only) add or subtract specific selected dielectrics (e.g., as thin films) in the gate stack design in a unified process integration methodology with the scaled CMOS logic technology to enable functionality equivalence from L1 through L5. This may potentially have, for example, multiple benefits, such as a) technology compatibility, b) productivity, c) enhancement in technology reliability, and d) reduction (e.g., elimination) of interfacing technology and packaging between different memory types and between logic and memories. For example, potential benefits at the system level may include not only process complexity reduction, but also, cost reduction, power reduction, and enhancements in performance, and reliability.

Multiple and wide-ranging memory cell performance and associated data throughput from the memory array may be built into the same USUM cell design. For example, this may be achieved by integrating dielectrics with well-defined intrinsic attributes into the dielectric stack design of an USUM memory cell while using a similar (e.g., the same) technology integration scheme. This may provide, for example, certain functionality and memory capability within a single memory array design that may not be feasible for conventional memories.

USUMs, for example, may allow for similar memory cell designs and array architectures throughout the memory hierarchy that may provide a spectrum of cycle time, latency targets, and data throughput to deliver varying functionality requirements that might be balanced for certain applications. Due to the process commonality, USUM-cell designs might be implemented in different capacity arrays and or subarrays within a single chip or multiple chips to address system cost, power, form-factor, performance, and durability objectives. This may provide more flexibility in system design, for example.

Some USUM memory cell designs, for example, may employ an energy-efficient direct tunneling mechanism to achieve desired system performance and functionality. For example, this approach may allow voltage scalability for programming memory cells, and, consequently, power savings, that may be difficult to achieve using conventional memories and hierarchical memory designs of comparable performance and applicability.

Band-engineered USUM memory cells, for example, may employ stack design and tailored programming to establish targeted speed-retention tradeoffs towards achieving the system data-rate throughput (L1/L2/L3/L4 functionality) for effective execution of functions. For example, this approach may reduce data transmission delays, and thus increase data availability, at appropriate processing nodes, reduce prefetch data storage requirements, reduce machine cycle time for execution of functions, reduce data refresh requirements, reduce complexity in bus design, etc.

USUM-memory-cell designs may provide, for example, unique sets of functional attributes via dielectric stack designs for FET based charge-trap memory cells. For example, the USUM memory cell and array design may have the potential to create superior digital systems.

To be consistent with the examples in FIGS. 3A and 3B discussed below, the y-direction in the following discussions of the examples in FIGS. 2A-2C may correspond to the lateral direction in FIGS. 3A and 3B, and the z-direction in FIGS. 2A-2C may correspond to the vertical direction in FIGS. 3A and 3B. Therefore, the stacks in the y-direction in FIGS. 2A-2C may be lateral stacks in FIGS. 3A and 3B. In the discussions, FIGS. 2A-2C when an element is over another element it may be over in the y-direction (e.g., the lateral direction), for example. For example, the dielectric stacks described below in conjunction with FIGS. 2B and 2C may be used for the dielectric stacks described below in the example of FIG. 3A.

Figure 2A:
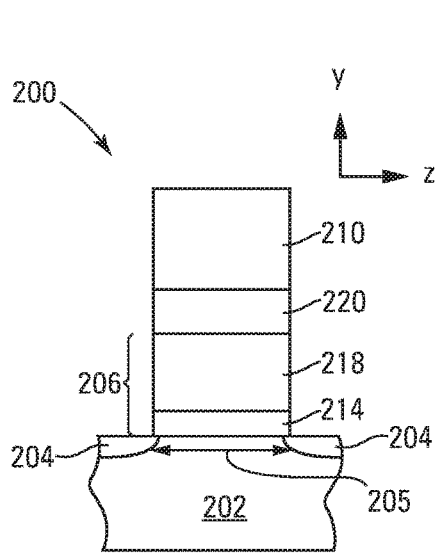
FIG. 2A illustrates an example of a transistor in accordance with a number of embodiments of the present disclosure.

FIG. 2A illustrates an example of a transistor 200, such as a field-effect transistor, that may be a logic transistor, for example, in accordance with a number of embodiments of the present disclosure. Transistor 200 may be adjacent to (e.g., over) a semiconductor 202, such as single crystal p$^-$ silicon. Source/drains 204 (e.g., n$^+$-type diffusion regions) may be in semiconductor 202. Transistor 200 may include a dielectric stack 206 adjacent to semiconductor 202 and source/drains 204. A control gate 210 may be adjacent to dielectric stack 206, and may, for example, be metal (e.g., tungsten, aluminum, etc.), or polysilicon (e.g., doped polysilicon, such as n$^+$-doped polysilicon), etc. A channel 205 may be formed between source/drains 204 during operation of transistor 200, for example.

In some examples, dielectric stack 206 may include an interface dielectric 214 (e.g., of oxygen-rich silicon oxynitride (OR—SiON) having a dielectric constant (K) of about 5.0) adjacent to semiconductor 202 and source/drains 204. Interface dielectric 214 may act as a silicon-interface dielectric, such as a gate dielectric, of transistor 200, for example. A high-K blocking dielectric 218 (e.g., of hafnium silicon oxynitride (HfSiON) having a K of about 14) of dielectric stack 206 may be adjacent to gate dielectric 214. An interface metallic 220, such as a gate-interface metallic, (e.g., tantalum nitride (TaN)) may be adjacent to blocking dielectric 218, and thus dielectric stack 206. Note, for example, that control gate 210 may be adjacent to interface metallic 220, and interface metallic 220 may act as a barrier between control gate 210 and blocking dielectric 218. In some examples, interface metallic 220 may act to create, at least in part, the threshold of transistor 200 by controlling the metal-insulator work function of the gate stacks for both the access gate as well as the control gate of the memory cell. In an example, the dielectric 214 might be about 1.0 nanometer to about 1.5 nanometers thick, and the blocking dielectric 218 might be about 6.0 nanometers thick.

Figure 2B:
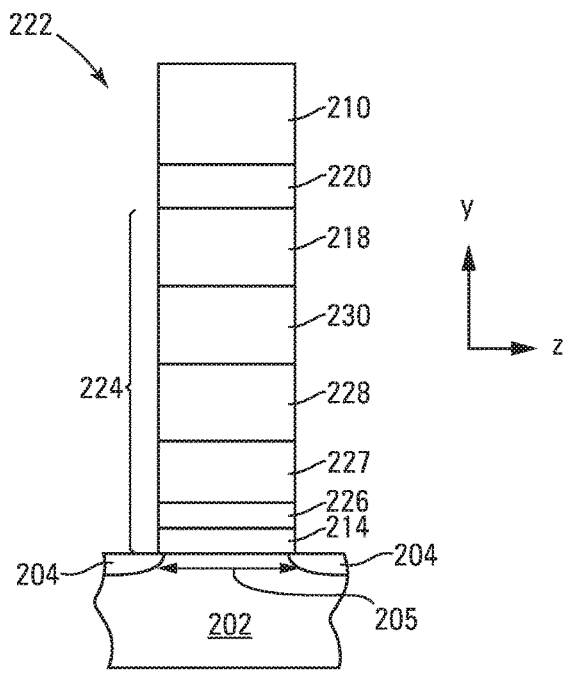
FIG. 2B illustrates an example of a non-volatile memory cell in accordance with a number of embodiments of the present disclosure.

FIG. 2B illustrates an example of a non-volatile memory cell 222 in accordance with a number of embodiments of the present disclosure. For example, FIG. 2B illustrates an example of a gate stack structure of non-volatile memory cell 222 in accordance with a number of embodiments of the present disclosure. In the example of FIG. 2B, additional dielectrics may be added to the dielectric stack 206 of transistor 200 to form a non-volatile dielectric stack 224 of memory cell 222 to store a charge. In some examples, memory cell 222 may be an L2-L3-level memory cell, such as an L2-L3-level USUM cell (e.g., that may replace an SRAM- or DRAM volatile memory cell). For example, memory cell 222 may function both as a L2 level memory cell as in a separate array or sub-array as well as an L3-level memory cell in another sub-array or may be in a main memory array of an electronic system. Table 1 provides an example of a dielectric stack 224 for an L2-L3-level memory cell.

TABLE 1

Example of a dielectric stack 224 (FIG. 2B) for an L3-Level Memory Cell

| Interface Dielectric 214 | Storage Dielectric 226 | Tunnel Dielectric 227 | Charge Trap 228 | Storage Dielectric 230 | Blocking Dielectric 218 |
|---|---|---|---|---|---|
| OR-SiON 1-1.5 nm | i-SRN 1 nm | HfSiON 2 nm | GaN 5 nm | i-SRN 5 nm | HfSiON 6 nm |

Dielectric stack 224 may include, for example, the interface dielectric 214 that may act as an interface tunnel dielectric of memory cell 222 and may be as described above in conjunction with transistor 200 in FIG. 2A. A (e.g., an ultra-thin) storage dielectric 226 (e.g., silicon-rich nitride (SRN) that may contain silicon nano-particles in nitride) may be adjacent to interface dielectric 214 in dielectric stack 224. For example, storage dielectric 226 might be about 1.0 nanometer thick and, for example, may have silicon nano-particles (e.g., with a diameter of about 1.0 nanometer) in nitride. Storage dielectric 226, for example, might be referred to as an injector dielectric (e.g., an injector-silicon-rich nitride (i-SRN)). For example, the storage dielectric 226 may act as an internal "electro-static-potential-modulator." Storage dielectric layer 226 may act, for example, to reduce reverse tunneling through internally generated repulsive field for charges stored in the charge trap 228 and the storage dielectric 230, discussed below (e.g., during a standby state of the memory), and thereby may extend the refresh time for the L2-L3 functionality. In some examples, storage dielectric 226 may store some charge and may act as a barrier to reduce charge leakage from memory cell 222.

A tunnel dielectric 227, such as HfSiON, may be adjacent to storage dielectric 226 in dielectric stack 224. For example, tunnel dielectric 227 might be about 2.0 nanometers thick for memory cell 222 (e.g., an L2-L3-level memory cell). The charge trap 228, such as gallium nitride (GaN) having a K of about 10, may be adjacent to tunnel dielectric 227 and, for example, may have a thickness of about 5.0 nanometers.

The storage dielectric 230 (e.g., i-SRN) may be adjacent to charge trap 228 in dielectric stack 224. For example, storage dielectric 230 might be about 5.0 nanometers thick. The blocking dielectric 218, as described above in conjunction with transistor 200 in FIG. 2A, may be adjacent to storage dielectric 230 in dielectric stack 224. The interface metallic 220, as described above in conjunction with transistor 200 in FIG. 2A, may be adjacent to blocking dielectric 218, and thus dielectric stack 224. The control gate 210, as described above in conjunction with transistor 200 in FIG. 2A, may be adjacent to interface metallic 220.

In some examples, interface dielectric 214 may be in direct physical contact with semiconductor 202, storage dielectric 226 in direct physical contact with interface dielectric 214, tunnel dielectric 227 in direct physical contact with storage dielectric 226, charge trap 228 in direct physical contact with tunnel dielectric 227, storage dielectric 230 in direct physical contact with charge trap 228, blocking dielectric 218 in direct physical contact with storage dielectric 230, interface metallic 220 in direct physical contact with blocking dielectric 218, and control gate 210 in direct physical contact with interface metallic 220.

In some examples, such as the example of Table 1, the effective oxide thickness (EOT) of dielectric stack 224 might be about 6.0 nanometers, where the EOT is the thickness that silicon dioxide ($SiO_2$) would need to be to have the capacitance of a material or stack of materials. For example, a dielectric stack 224 having an EOT of about 6.0 nanometers means that the capacitance of dielectric stack 224 is the capacitance of about 6.0 nanometers of $SiO_2$. The EOT of the combined tunnel dielectrics 214 and 227 (e.g., tunnel EOT), such as for the example of Table 1, may be less than about 2.0 nanometers.

The program/erase time for a memory cell 222 (e.g., having the dielectric stack 224 in the example of Table 1) might be about 30 nanoseconds to about 50 nanoseconds (e.g., in the range of some DRAMs) for a program/erase voltage of about ±4.0 V, for example. For some examples, such as for the example of Table 1, the initial memory window of memory cell 222 might be about 2.0 V, and the end-of-life memory window might be greater than about 1.0 V. The end-of-life endurance of memory cell 222, for some examples, such as the example of Table 1, may be greater than about 10 billion write/erase cycles, compared to about a million write/erase cycles for conventional non-volatile memory cells. The retention of memory cell 222, for some examples, such as the example of Table 1, may be on the order of hours (e.g., considerably longer than conventional DRAM that may need to be refreshed about every 10 milliseconds). The peak write/erase field (e.g., a measure of the charge transport energy) of memory cell 222, for some examples, such as the example of Table 1, may be less than about 7.5 megavolts/centimeter, compared with about 12.0 megavolts/centimeter to about 15.0 megavolts/centimeter for conventional nonvolatile memory cells.

Note that non-volatile memory cell 222 may be created from the basic transistor 200 by adding additional dielectric layers, such as storage dielectric 226, tunnel dielectric 227, charge trap 228, and storage dielectric 230 to the dielectric stack 206 of transistor 200 to create the dielectric stack 224 of memory cell 222. Note further, for example, that incorporating such additional dielectric layers provide a means of required carrier transport and charge storage within the gate dielectric stack to provide L2-L3 functionality for the memory cell 222. Therefore, for example, non-volatile memory cell 222 may be considered to be unified with the FET based transistor technology which provides the transistor 200 (e.g., FET based technology).

As indicated above, memory cell 222 may be an L2-L3-level non-volatile memory cell. However, the dielectric stack 224 of memory cell 222 may be adjusted so that memory cell 222 may become an L3-L4-level non-volatile memory cell, such as an L3-L4-level USUM cell, that may replace conventional NAND non-volatile memory cells and/or conventional NROM non-volatile memory cells. For example, memory cell 222 may function as an L4-level memory cell and may be in a storage memory of an electronic system. Increasing the thickness of tunnel dielectric 227 from about 2.0 nanometers (e.g., L2-L3-level cell) to about 3.0 to 4.0 nanometers, for example, while leaving the remaining dielectrics of dielectric stack 224 as described above (e.g., as shown in the example of Table 2) may cause memory cell 222 to function as an L4-level memory cell.

TABLE 2

Example of a dielectric stack 224 (FIG. 2B) for an L4-Level Memory Cell

| Interface Dielectric 214 | Storage Dielectric 226 | Tunnel Dielectric 227 | Charge Trap 228 | Storage Dielectric 230 | Blocking Dielectric 218 |
|---|---|---|---|---|---|
| OR-SiON 1-1.5 nm | i-SRN 1 nm | HfSiON 3-4 nm | GaN 5 nm | i-SRN 5 nm | HfSiON 6 nm |

In some examples, such as the example of Table 2, the EOT of the dielectric stack of the resulting L3-L4-level non-volatile memory cell may be about 7.0 nanometers; the EOT of the combined tunnel dielectrics 214 and 227 may be less than about 2.5 nanometers; and the program/erase time of the resulting L3-L4-level non-volatile memory cell might be about 1.0 microsecond for a program/erase voltage of about ±5.0 V. Moreover, the resulting L3-L4-level non-volatile memory cell, for some examples, such as the example of Table 2, may have an end-of-life endurance of about greater than 10 billion write/erases, a retention on the order of days, and a peak write/erase field less than about 7.5 megavolts/centimeter. The initial memory window of the resulting L4-level non-volatile memory cell might be greater than about 3.0 V, and the end-of-life memory window might be greater than about 1.5 V, for some examples, such as the example of Table 2. Note that increasing the thickness of tunnel dielectric 227 in memory cell 222 (e.g., from that in Table 1 to that in Table 2) may act to increase the retention and memory window at the expense of speed (e.g., program/erase time) to create an L4-level cell from an L3-level cell.

Figure 2C:
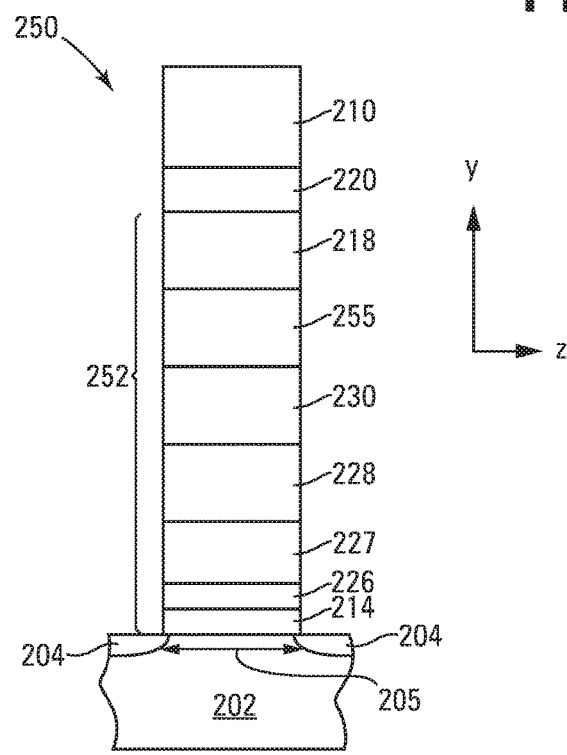
FIG. 2C illustrates another example of a non-volatile memory cell in accordance with a number of embodiments of the present disclosure.

FIG. 2C illustrates an example of a non-volatile memory cell 250 in accordance with a number of embodiments of the present disclosure. In the example of FIG. 2C, additional dielectrics are added to the dielectric stack 206 of transistor 200 to form a non-volatile dielectric stack 252 of memory cell 250 to store a charge. In some examples, memory cell 250 may be an L4-L5-level memory cell, such as an L4-L5-level USUM cell, that may be in a memory that may replace HDD. For example, Table 3 illustrates an example of a dielectric stack 252 for an L4-L5-level memory cell. For example, increasing the thickness of tunnel dielectric 227 from its thickness in either the L3-level cell (e.g., in Table 1) or the L-4 level cell in (e.g., in Table 2) and adding a blocking dielectric (e.g., of aluminum oxide (Al$_2$O$_3$) to the dielectric stacks of either the L3-level cell or the L-4 level cell may act to produce memory cell 250.

TABLE 3

Example of a dielectric stack 252 (FIG. 2C) for an L4-L5-Level Memory Cell

| Interface Dielectric 214 | Storage Dielectric 226 | Tunnel Dielectric 227 | Charge Trap 228 | Storage Dielectric 230 | Blocking Dielectric 255 | Blocking Dielectric 218 |
|---|---|---|---|---|---|---|
| OR-SiON 1-1.5 nm | i-SRN 1 nm | HfSiON 6-8 nm | GaN 5 nm | i-SRN 5 nm | Al$_2$O$_3$ 4 nm | HfSiON 6 nm |

Dielectric stack 252 may include, for example, interface dielectric 214 (e.g., as described above in conjunction with memory cell 222 in FIG. 2B) adjacent to semiconductor 202 and source/drains 204, storage dielectric 226 (e.g., as described above in conjunction with memory cell 222 in FIG. 2B) adjacent to interface dielectric 214, tunnel dielectric 227 (e.g., as described above in conjunction with memory cell 222 in FIG. 2B, except that tunnel dielectric 227 may be about 6.0 nanometers to about 8.0 nanometers thick) adjacent to storage dielectric 226, charge trap 228 (e.g., as described above in conjunction with memory cell 222 in FIG. 2B) adjacent to tunnel dielectric 227, and storage dielectric 230 (e.g., as described above in conjunction with memory cell 222 in FIG. 2B) adjacent to charge trap 228.

A blocking dielectric 255 may be adjacent to storage dielectric 230 in dielectric stack 252, for example. In some examples, blocking dielectric 255 may be aluminum oxide (Al$_2$O$_3$) having a K of about 10 and, for example, a thickness of about 4.0 nanometers. The blocking dielectric 218 may be adjacent to blocking dielectric 255 in dielectric stack 252. The interface metallic 220 may be adjacent to blocking dielectric 218, and thus dielectric stack 252. The control gate 210 may be adjacent to interface metallic 220.

In some examples, interface dielectric 214 may be in direct physical contact with semiconductor 202, storage dielectric 226 in direct physical contact with interface dielectric 214, tunnel dielectric 227 in direct physical contact with storage dielectric 226, charge trap 228 in direct physical contact with tunnel dielectric 227, storage dielectric 230 in direct physical contact with charge trap 228, blocking dielectric 255 in direct physical contact with storage dielectric 230, blocking dielectric 218 in direct physical contact with blocking dielectric 255, interface metallic 220 in direct physical contact with blocking dielectric 218, and control gate 210 in direct physical contact with interface metallic 220.

In some examples, such as the example of Table 3, the EOT of dielectric stack 252 may be about 9.0 nanometers; the EOT of the combined tunnel dielectrics 214 and 227 may be about 3.3 nanometers; and the program/erase time of memory cell 250 might be about 1.0 millisecond for a program/erase voltage of about ±7.5 V. Moreover, memory cell 250, for some examples, such as the example of Table 3, may have an end-of-life endurance of about greater than 10 billion write/erases, a retention greater than about 10 years, and a peak write/erase field less than about 7.8 megavolts/centimeter. The initial memory window of memory cell 250, for some examples, such as the example of Table 3, might be greater than about 6.0 V, and the end-of-life memory window might be greater than about 4.0 V, for example. Note, for example, that increasing the thickness of tunnel dielectric 227 in memory cell 222 (e.g., from that in Table 1 or that in Table 2 to that in Table 3) and adding dielectric 255 may act to increase the retention and memory window at the expense of speed (e.g., program/erase time) to create an L5-level cell from either an L3- or L4-level cell.

Non-volatile memory cell 250 may be created from the basic transistor 200 by adding storage dielectric 226, tunnel dielectric 227, charge trap 228, storage dielectric 230, and blocking dielectric 255 to the dielectric stack 206 of transistor 200 to create the dielectric stack 252 of transistor 250. For example, non-volatile memory cell 250 may be said to be transistor based. Note that the dielectric stacks discussed above in conjunction with FIGS. 2A-2C (e.g., dielectric stacks 206, 224, and 252) may be formed by a single machine (e.g., a single low-pressure-chemical-vapor-deposition (CVD) system) that can reduce fabrication cost.

Note that interface dielectric 214, storage dielectric 226, tunnel dielectric 227, charge trap 228, storage dielectric 230, blocking dielectric 218, and interface metallic 220 may be common to the dielectric stacks of the L3- and L4-level memory cells (e.g., dielectric stack 224) and the L5-level memory cell (e.g., dielectric stack 252), discussed above. In some examples, an integration scheme may be adopted that would first define the L3-, L4-, and L5-level non-volatile memory array regions.

Interface dielectric 214, storage dielectric 226, and tunnel dielectric 227 may then be formed in the L3-, L4-, and L5-level memory array regions. Subsequently, the L3-level memory array region may be protected while an additional thickness of tunnel dielectric 227 is formed in the defined L4- and L5-level memory array regions. The process may be repeated by protecting the L3- and L4-level memory array regions while an additional thickness of tunnel dielectric 227 is formed in the L5-level memory array region. Charge trap 228 may then be formed in the L3-, L4-, and L5-level memory array regions (e.g., over tunnel dielectric 227). Storage dielectric 230 may then be formed in the L3-, L4-, and L5-level memory array regions (e.g., over charge trap 228). Then, the L3- and L4-level memory array regions may be protected while forming blocking dielectric 255 in the L5-level memory array region (e.g., over storage dielectric 230). Then, blocking dielectric 218 and interface metallic 220 may be formed in the L3-, L4-, and L5-level memory array regions.

In some examples, the relatively low peak write/erase fields of the dielectric stacks of the memory cells discussed above in conjunction with FIGS. 2B and 2C (e.g., less than about 7.8 megavolts/centimeter compared with about 12.0 megavolts/centimeter to about 15.0 megavolts/centimeter for conventional nonvolatile memory cells) can result in the relatively large end-of-life endurance for the memory cells discussed above (e.g., about greater than 10 billion write/erases, compared to about a million write/erases for conventional non-volatile memory cells).

The examples of the dielectric stacks of the memory cells discussed above in conjunction with FIGS. 2B and 2C may include a double-tunnel structure (e.g., interface dielectric 214 and tunnel dielectric 227) that may act to enhance the programming speed at a reduced programming voltage (e.g., about 30 nanoseconds to about 50 nanoseconds for a program/erase voltage of about ±4.0 V for the L3-level memory cell, about 1.0 microsecond for a program/erase voltage of about ±5.0 V for the L4-level cell, and about 1.0 millisecond for a program/erase voltage of about ±7.5 V for the L5-level cell).

In some examples, the charge trap 228 (e.g., GaN) in the dielectric stacks of the memory cells discussed above in conjunction with FIGS. 2B and 2C may have a relatively large band offset (e.g., FIG. 2D) and may combine with storage dielectrics 226 and 230 (e.g., i-SRN) of those gate stacks to provide (e.g., simultaneously) the relatively large memory windows and the relatively long retentions (e.g., as discussed above in conjunction with FIGS. 2B and 2C). The tunnel EOTs discussed above in conjunction with FIGS. 2B and 2C may be adjusted, for example, to achieve trade-offs between retention and speed. For example, the retentions and program/erase times may be different for the different tunnel EOT's of the L3-, L4-, and L5-level memory cells discussed in conjunction with FIGS. 2B and 2C.

The blocking dielectric 218 and the interface metallic 220 (e.g., TaN) in the dielectric stacks discussed above in conjunction with FIGS. 2B and 2C may act, for example, to reduce undesirable charge injection from control gate 210. In some examples, the high-K dielectrics, such as HfSiON with a breakdown strength of about 20 megavolts/centimeter and low intrinsic charge trapping characteristic, may act to enhance device reliability.

Figure 2D:
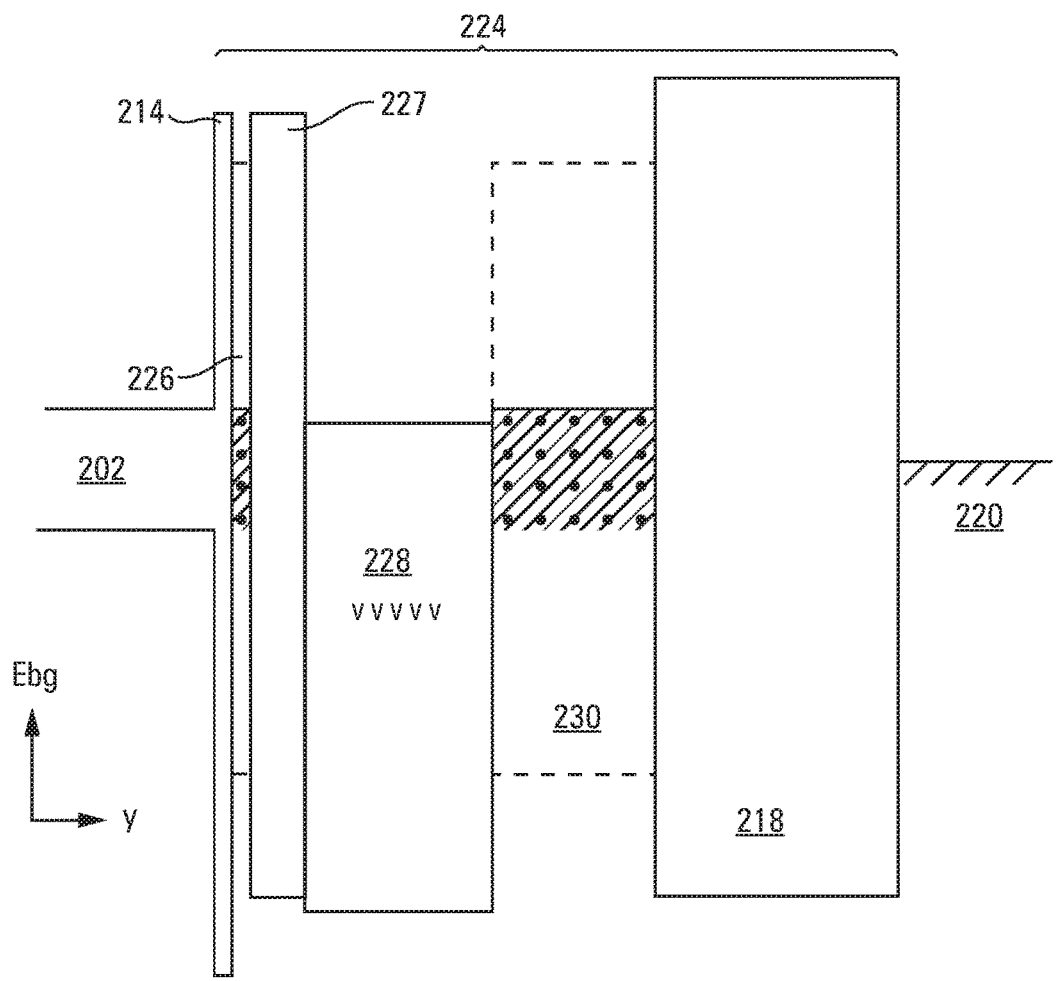
FIG. 2D is an example of a band-offset diagram of a dielectric stack in accordance with a number of embodiments of the present disclosure.

FIG. 2D is an example of a band-gap-energy- (Ebg) offset diagram of a dielectric stack, such as dielectric stack 224 in the examples of FIG. 2B, Table 1, and Table 2 in accordance with a number of embodiments of the present disclosure. For example, FIG. 2D may show Ebg as a function of the distance in the y-direction from semiconductor 202, e.g., in the absence of a voltage differential being applied across the memory cell with dielectric stack 224. The reference numbers in FIG. 2D correspond to the reference numbers that identify the dielectrics in FIG. 2B. For example, in FIG. 2D (as in FIG. 2B), interface dielectric 214 (e.g., OR—SiON) is adjacent to semiconductor 202 (e.g., P⁻ polysilicon); storage dielectric 226 (e.g., i-SRN) is adjacent to interface dielectric 214; tunnel dielectric 227 (e.g., HfSiON) is adjacent to storage dielectric 226, charge trap 228 (e.g., GaN) is adjacent to storage dielectric 226; storage dielectric 230 (e.g., i-SRN) is adjacent to charge trap 228; blocking dielectric 218 is adjacent to storage dielectric 230; and interface metallic 220 is adjacent to blocking dielectric 218. In some examples, the combination of layers 224, 225 and 227 forms what may be called a "Modified Double Tunnel Junction" or MDTJ 258.

In FIG. 2D, the bottom boundary of a respective band may, for example, represent the valence energy of the material of the respective band, and the top boundary of a respective band may, for example, represent the conduction energy of the material of the respective band. For example, a respective band represents the energy difference (e.g., band-gap energy Ebg) between the conduction energy and the valence energy.

Figure 2E:
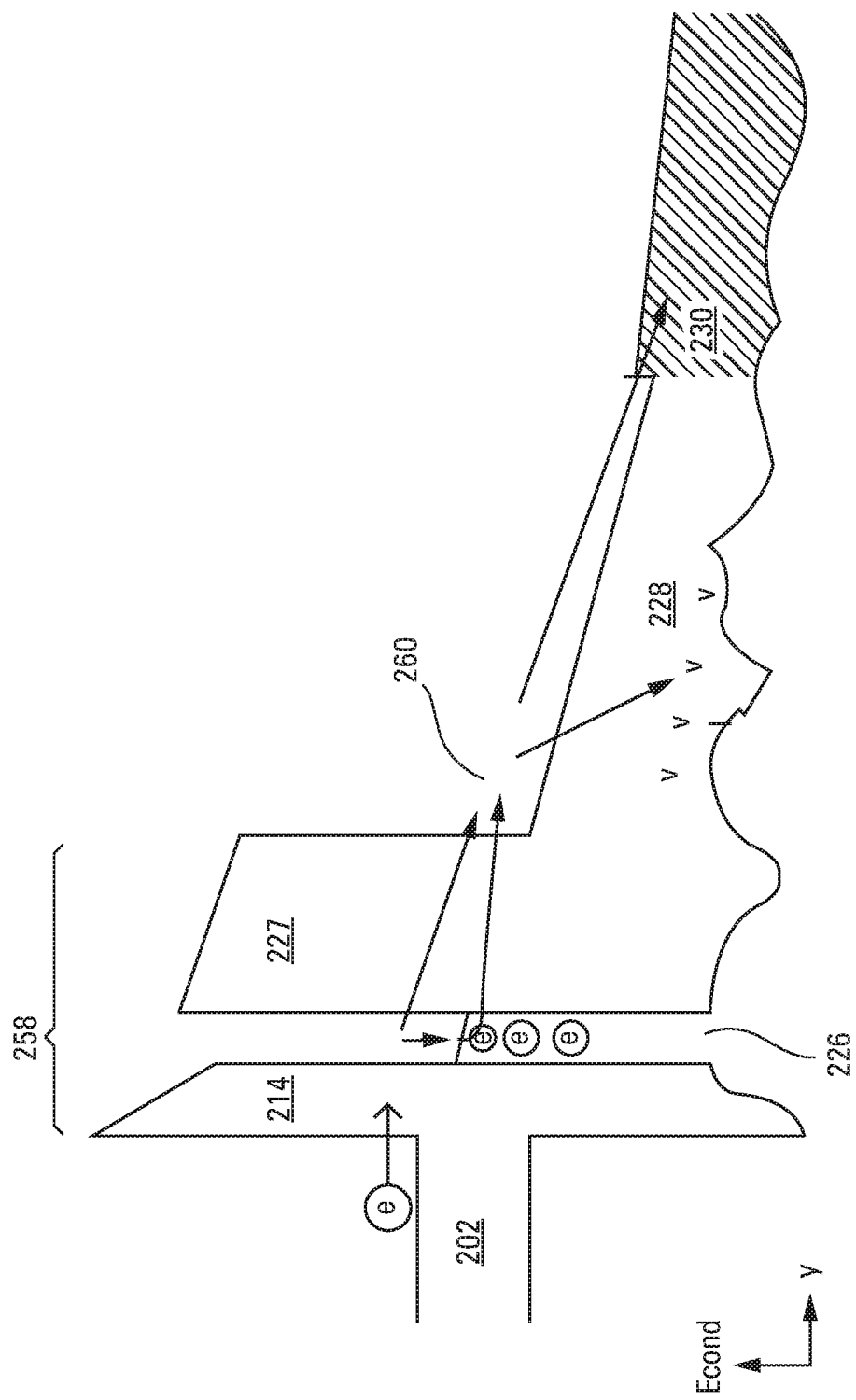
FIG. 2E is an example of a conduction band diagram of a portion of a dielectric stack during programming in accordance with a number of embodiments of the present disclosure.

FIG. 2E is an example of a conduction-energy- (e.g., Econd) band diagram of a portion of a dielectric stack, such as dielectric stack 224 in the examples of FIG. 2B, Table 1, and Table 2, showing charge transport during programming, for example, in accordance with a number of embodiments of the present disclosure. The reference numbers in FIG. 2E correspond to the reference numbers that identify the components in FIG. 2B. For example, in FIG. 2E (as in FIG. 2B), interface dielectric 214 (e.g., OR—SiON) is adjacent to semiconductor 202 (e.g., P⁻ polysilicon); storage dielectric 226 (e.g., i-SRN) is adjacent to interface dielectric 214; tunnel dielectric 227 (e.g., HfSiON) is adjacent to storage dielectric 226, and charge trap 228 (e.g., GaN) is adjacent to tunnel dielectric 227. Note, for example, the double tunneling denoted by reference number 260.

For example, FIG. 2E may illustrate the conduction energies in response to an electrostatic field, resulting from a programming voltage being applied to control gate 210 (e.g., while semiconductor 202 may be grounded). For example, FIG. 2E may be in response to a programming-voltage differential across a memory cell (e.g., the difference between the voltage applied to control gate 210 and a voltage applied semiconductor 202 (e.g., to a channel 205 between the source/drains 204 in FIGS. 2B and 2C)). For example, FIG. 2E shows the conduction energy Econd as a function of the distance in the y-direction from semiconductor 202, for example.

Charges (e.g., electrons) from semiconductor 202 may not have enough energy to surmount the relatively high conduction energy (e.g., about 3.0 electron volts) barrier of interface dielectric 214. For example, the electrostatic field may not be strong enough to bring the charges to the conduction energy of interface dielectric 214. However, the thickness of interface dielectric 214 (e.g., about 1.0 nanometer to about 1.5 nanometers) may be sufficiently small to allow the charge from semiconductor 202 to tunnel directly through interface dielectric 214 (e.g., to the nanocrystals of layer 226). For example, charge (e.g., electron) transport through interface dielectric 214 may be by direct tunneling (e.g., due to quantum mechanical effects). The interface dielectric 214 may be to pass charges from semiconductor 202 by direct tunneling.

In some examples, some (e.g., at least a portion of the) charges from interface dielectric 214 may be stored (e.g., held) in storage dielectric 226. For example, the charges may be held temporarily in storage dielectric 226. This may act, for example, to hold up some of the charge that passes through interface dielectric 214.

After the voltage differential across the memory cell is removed (e.g., after programming is completed), some of the charges may remain in storage dielectric 226 and may act to produce a repulsive electrostatic field (e.g., a reverse potential) for the charges stored in layers 228 and 230, for example. The reverse electrostatic field may act to reduce charge leakage toward semiconductor 202 that may act, for example, to increase the memory window and the retention of the memory cell and to increase the time between refreshes. In this respect, for example, storage dielectric 226 may act as a barrier to charge transport toward semiconductor 202.

Figure 3A:
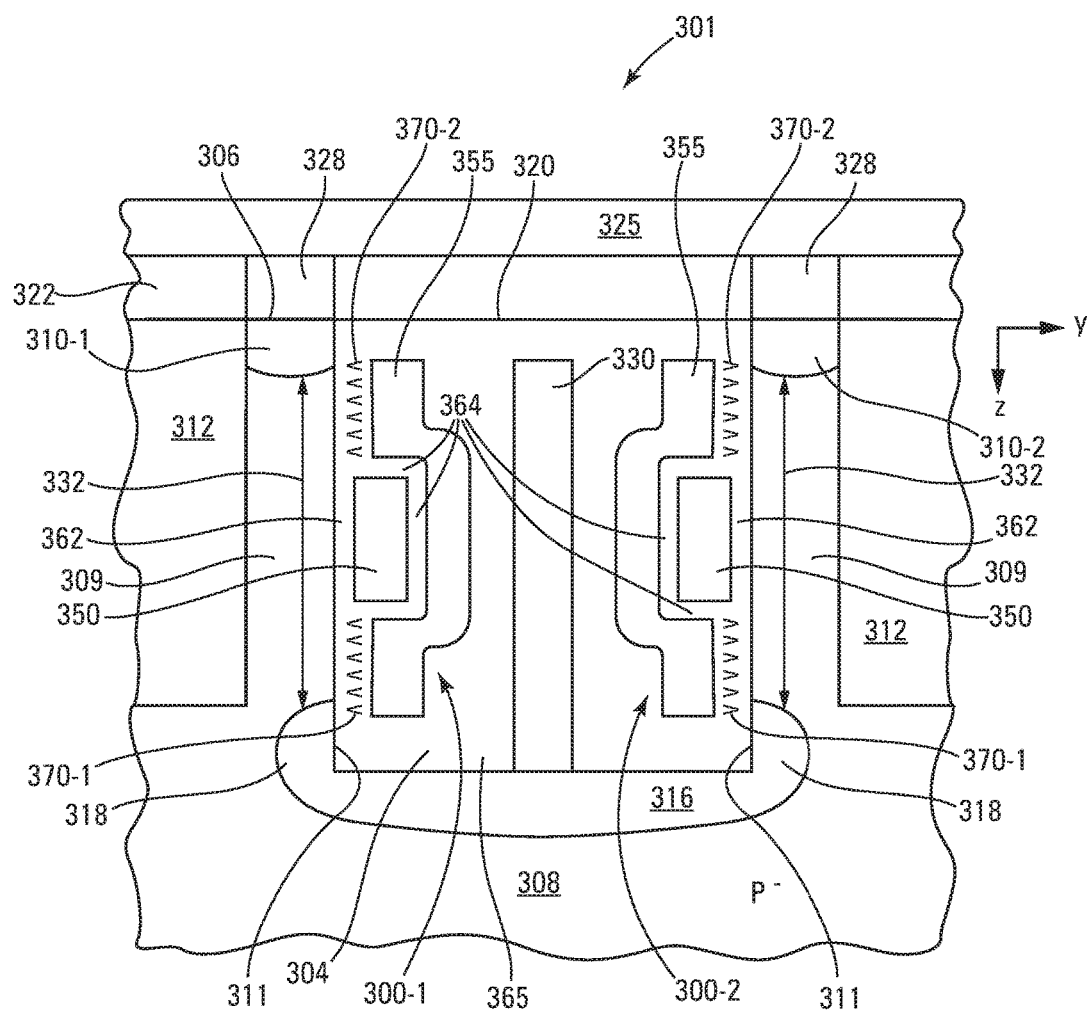
FIG. 3A is cross-sectional view of an example of a portion of a memory array in accordance with a number of embodiments of the present disclosure.
Figure 3B:
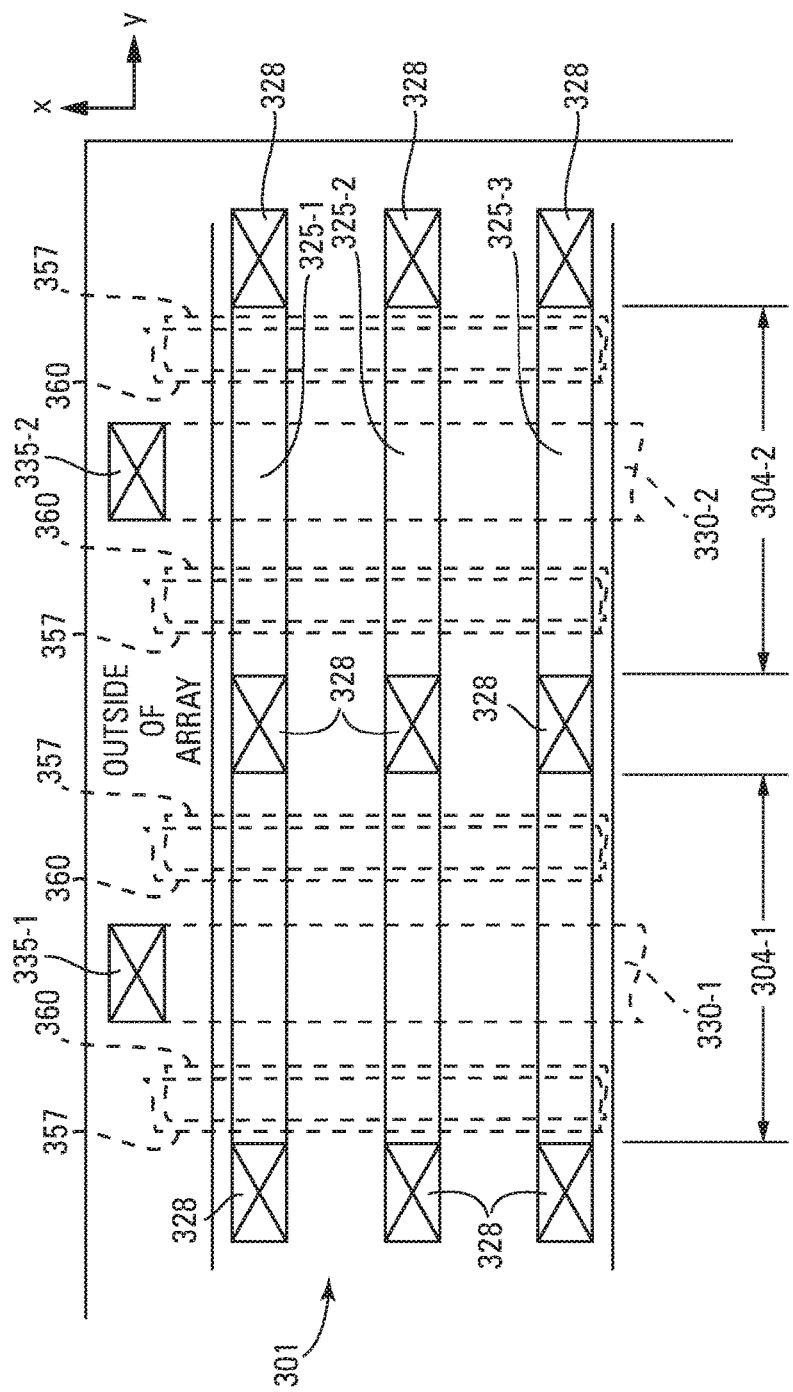
FIG. 3B is a top-down view of an example of a portion of a memory array in accordance with a number of embodiments of the present disclosure.

FIG. 3A is cross-sectional view of an example of a portion of a memory array 301 in accordance with a number of embodiments of the present disclosure. FIG. 3B is a top-down view of memory array 301 in accordance with a number of embodiments of the present disclosure. Common numbering is used denote similar (e.g., the same) elements in FIGS. 3A and 3B. FIG. 3A may be in the y-z plane, where the z-direction may be in the vertical direction. FIG. 3B may be in the x-y plane, where the x-direction is perpendicular to the face plane of FIG. 3A, and the z-direction is perpendicular to the face plane of FIG. 3B.

The expression lateral to may refer to the horizontal direction (e.g., the y-direction) that may be perpendicular to the vertical direction, for example. A particular element being laterally between two elements may include the particular element being lateral to one of the two elements in a first direction and the other of the two other elements being lateral to the particular element in a second (e.g., opposite) direction. A particular element being vertically between two elements may include the particular element being vertically above one of the two elements and vertically below the other of the two other elements. Elements being vertically separated may include the elements being separated from each other in the vertical direction (e.g., the z-direction), along a vertical line or plane, for example.

It should be recognized the term vertical accounts for variations from "exactly" vertical due to routine manufacturing, measuring, and/or assembly variations and that one of ordinary skill in the art would know what is meant by the term vertical. It should be recognized the term horizontal accounts for variations from "exactly" horizontal due to routine manufacturing, measuring, and/or assembly variations and that one of ordinary skill in the art would know what is meant by the term horizontal. It should be recognized the terms perpendicular and parallel respectively account for variations from "exactly" perpendicular and "exactly" parallel due to routine manufacturing, measuring, and/or assembly variations and that one of ordinary skill in the art would know what is meant by the terms perpendicular and parallel.

Memory array 301 includes memory cells 300, such as memory cells 300-1 and 300-2. References to a memory cell 300 herein may be taken to mean either memory cell 300-1 or memory cell 300-2, and references to memory cells 300 may be taken to include memory cell 300-1 and memory cell 300-2. Memory cells 300 are in a region 304, which may be referred to as a trench, that may extend vertically below (e.g., in the z-direction) from an upper (e.g., a topmost) horizontal surface 306 of a semiconductor 308, such as single crystal p⁻ silicon. Note, for example, that the portion of semiconductor 308 having its upper surface denoted by reference number 306 may be conductively doped to have a different conductivity type (e.g., n-type) than the bulk semiconductor 308 (e.g., a portion of which may have a P conductivity type). Note that the upper surface of other portions of semiconductor 308 not shown may also be denoted by reference number 306 and may be co-planer with the upper surface 306 shown in FIG. 3A, for example.

Vertical portions 309 of semiconductor 308 on either side of region 304 may form vertical sides (e.g., vertical sidewalls) 311 of region 304. For example, a vertical side 311 may be a vertical surface of semiconductor 308. That is, the vertical surface may be a vertical surface of a portion 309 of semiconductor 308.

A source/drain 310 may be in each portion 309 of semiconductor 308. For example, a source/drain 310-1 may be of (e.g., may be used with) memory cell 300-1, and a source/drain 310-2 may be of (e.g., may be used with) memory cell 300-2. References to a source/drain 310 herein may be taken to mean either source/drain 310-1 or source/drain 310-2, and references to source/drains 310 may be taken to include source/drain 310-1 and source/drain 310-2. An isolation region 312, such as a shallow-trench-isolation (STI) region, may be located lateral to each of the portions 309 of semiconductor 308. The upper surfaces of isolation regions 312, for example, may be coplanar (e.g., flush) with the upper surface 306 of semiconductor 308, as shown in FIG. 3A.

In some examples, source/drains 310 may be formed by conductively doping portions 309. For example, source/drains 310 may have an n⁺-type conductivity. Source/drains 310 may extend from upper surface 306 into portions 309 of semiconductor 308, as shown in FIG. 3A. For example, the upper (e.g., topmost) surfaces of source/drains 310 may be coplanar (e.g., flush) with the upper surface 306 of semiconductor 308, as shown in FIG. 3A.

A source/drain 316 may be in semiconductor 308, as shown in FIG. 3A. For example, source/drain 316 may be formed by conductively doping semiconductor 308 to have an n-type conductivity, such as an n⁺ conductivity type, and maybe referred to as a linked diffusion, for some examples. A portion of source/drain 316 may form a bottom of region 304, for example. Portions 318 of source/drain 316, for example, may extend into portions 309. For example, a portion 318 may form a portion of a vertical side 311 of region 304.

Source/drain 316, for example, may be common to both of memory cells 310-1 and 310-2. For example, source/drain 316 may be used with memory cell 310-1 or memory cell 310-2. For example, source/drain 310-1 and source/drain 316 may be used with memory cell 310-1, and source/drain 310-2 and source/drain 316 may be used with memory cell 310-2. A source/drain 310 may, for example, operate as a source while source/drain 316 operates as a drain, or a source/drain 310 may, for example, operate as a drain while source/drain 316 operates as a source. Source/drains 310 may be vertically above source/drain 316, for example.

An upper (e.g., a topmost) surface 320 of region 304 may be coplanar (e.g., flush) with the upper surface 306 of semiconductor 308 and the upper surfaces of isolation regions 312. A dielectric 322, such as an oxide (e.g., $SiO_2$), may be over the upper surface 306 of semiconductor 308, the upper surface 320 of region 304, and the upper surfaces of isolation regions 312. A data line 325, such as a bit line, may be over dielectric 322 and may operate either as a data line 325 or a source, for example. Respective ones of electrically conductive contacts 328 may pass through dielectric 322 and may respectively couple (e.g., connect) respective ones of source/drains 310 to data line 325. For example, contacts 328 might be self-aligned contacts that might self-align with source/drains 310 and data line 325. The use and formation of self-aligned contacts is well known in the art and will not be detailed herein.

A conductor 330 may be coupled (e.g., connected) to source/drain 316 (e.g., by direct physical contact), and may be between (e.g., laterally between) memory cell 300-1 and memory cell 300-2. Conductor 330 may be coupled (e.g., connected) to a buried contact 335. For example, a conductor 330-1 might be coupled to a contact 335-1 (e.g., outside of array 301), and a conductor 330-2 might be coupled to a contact 335-2 (e.g., outside of array 301), as shown in FIG. 3B. In some examples, contacts 335-1 and 335-2 might be coupled to a common source, whereas in other examples, contacts 335-1 and 335-2 might be operated independently of each other. In some examples, all contacts, except for contacts 328 that may be self-aligned to be about the same width (e.g., in the x-direction in FIG. 3B) as data line 325, may be outside of array 301. As such, array 301 may be referred to as a "contactless" array, for example. Eliminating contacts in memory array 301, but for the self-aligned contacts, may allow for higher densities of memory cells in memory array 301.

In some examples, each of memory cells 300 (e.g., each of memory cells 300-1 and 300-2) may be a vertical-channel-split-gate NROM non-volatile memory cell. During operation of a memory cell 300, for example, a vertical channel 332 of that memory cell 310 may be formed in a portion 309 of semiconductor 308 adjacent to that memory cell 300 and between a source/drain 310 and source/drain 316. The vertical region between a source/drain 310 and source/drain 316 corresponding to a channel 332 might be referred to as a vertical channel region of a memory cell 310, for example.

Each memory cell 300 may be adjacent to (e.g., and lateral to) a respective vertical side 311 and may include an access gate 350 adjacent to (e.g., and lateral to) vertical side 311 and a control gate (e.g., a program gate) 355 adjacent to access gate 350. Access gate 350, for example, may be vertically below upper surface 306 of semiconductor 308 and may be connected to or form a portion of an access line 357 (e.g., extending in the x-direction in FIG. 3B), such as a word line. Control gate 355, for example, may be vertically below upper surface 306 of semiconductor 308 and may be connected to or form a portion of a control line (e.g., a program line) 360 (e.g., extending in the x-direction in FIG. 3B).

The dashed lines in FIG. 3B denote elements that are vertically below the upper surface 306 of semiconductor 308. For example, semiconductor 308 might be a base structure, and upper surface 306 might be a base surface (e.g., in the x-y plane) of an integrated circuit die that might include memory array 301. The vertical (e.g., the z-) direction may be perpendicular to the base surface, for example. It will be appreciated that the terms vertical and vertical direction are used to denote directions perpendicular to a base surface and are intended to cover any direction perpendicular to a base surface (e.g., depending on the orientation of the base surface).

In some examples, a gate dielectric 362 may be laterally between an access gate 350 and an adjacent portion 309 of semiconductor 308 (e.g., an adjacent vertical side 311 of region 304). For example, gate dielectric 362 may be adjacent to a portion of vertical side 311 of region 304 (e.g., adjacent to a portion of portion 309 of semiconductor 308). For example, gate dielectric 362 may be lateral to portion 309 of semiconductor 308 in the y-direction. Gate dielectric 362 may be an oxide (e.g., $SiO_2$ or OR—SiON). A dielectric 364 (e.g., an oxide, such as $SiO_2$ or HfSiON, etc.) may be between access gate 350 and control gate 355 and may capacitively couple access gate 350 to control gate 355. Access gate 350 may be adjacent to gate dielectric 362 and may be lateral to gate dielectric 362 in the y-direction. In some examples, gate dielectric 362 may be direct physical contact with an adjacent portion 309 of semiconductor 308 and access gate 350, and dielectric 364 may be direct physical contact access gate 350 and control gate 355.

Conductors 330, access gates 350, and control gates 355 may include one or more conductive materials. In one example, conductors 330, access gates 350, and control gates 355 may be conductively-doped polysilicon, such as $n^+$-doped polysilicon. In another example, conductors 330, access gates 350, and control gates 355 may be metal, such as tungsten or aluminum, or a metal-containing material, such as a metal-containing material on polysilicon (e.g., a refractory metal silicide formed on a conductively-doped polysilicon). The metals of chromium (Cr), cobalt (Co), hafnium (Hf), molybdenum (Mo), niobium (Nb), tantalum (Ta), titanium (Ti), tungsten (W), vanadium (V), zirconium (Zr) are examples of refractory metals. In some examples, data lines 325 might be aluminum, copper, tungsten, etc.

Control gate 355 might be a single continuous structure, for example, and might wrap around a portion of access gate 350, in some examples, so that an upper portion of control gate 355 is vertically above at least a portion of an upper (e.g., topmost) edge of access gate 350 and a lower portion of control gate 355 is vertically below at least a portion of a lower (e.g., bottommost) edge of access gate 350, where the upper edge is vertically above the lower edge. That is, access gate 350 may be vertically between the upper and lower portions of control gate 355.

A dielectric stack 370 of a memory cell 300 may be on either side of an access gate 350 and between a control gate 355 and an adjacent portion 309 of semiconductor 308 (e.g., an adjacent vertical side 311 of region 304). For example, dielectric stacks 370 may be adjacent to portion 309 of semiconductor 308, and, for example, may be lateral to portion 309 of semiconductor 308 in the y-direction, and, for example may extend laterally in the y-direction from vertical side 311 to control gate 355.

For example, a lower dielectric stack 370-1 may be vertically below the lower edge of access gate 350 and laterally between portion 309 and the lower portion of control gate 355, and an upper dielectric stack 370-2 may be vertically above the upper edge of access gate 350 and laterally between portion 309 and the upper portion of control gate 355. The lower dielectric stack 370-1, for example, may be coupled to (e.g., by direct physical contact with) portion 309 and the lower portion of control gate 355, and the upper dielectric stack 370-2, for example, may be coupled to (e.g., by direct physical contact with) portion 309 and the upper portion of control gate 355. Lower dielectric stack 370-1, for example, may be coupled to (e.g., by direct physical contact with) an interface metallic, such as the interface metallic 220 discussed above in conjunction with FIGS. 2A-2C, that may be coupled to (e.g., by direct physical contact with) the lower portion of control gate 355, and upper dielectric stack 370-2, for example, may be coupled to (e.g., by direct physical contact with) an interface metallic 220 that may be coupled to (e.g., by direct physical contact with) the upper portion of control gate 355. For example, an interface metallic 220 may couple lower dielectric stack 370-1 to the lower portion of control gate 355, and an interface metallic 220 may couple upper dielectric stack 370-2 to the upper portion of control gate 355.

Note that a source/drain 310 may be adjacent to and lateral to upper dielectric stack 370-2, and a portion 318 of source/drain 316 may be adjacent to and lateral to lower dielectric stack 370-1. In some examples, a portion 309 of semiconductor 308 may be a vertical portion 309 of semiconductor 308 located laterally between an isolation region 312 and a memory cell 300, and thus, for example, laterally between a lower dielectric stack 370-1 and the isolation region 312, laterally between a gate dielectric 362 and the isolation region 312, and laterally between an upper dielectric stack 370-2 and the isolation region 312.

Upper dielectric stack 370-2 may be vertically above and separate from lower dielectric stack 370-1, for example. Upper dielectric stack 370-2, lower dielectric stack 370-1, and gate dielectric 362 may be vertically aligned (e.g., in the z-direction) parallel to a vertical side 311 of region 304 and a channel 332. For example, gate dielectric 362 may be vertically between upper dielectric stack 370-2 and lower dielectric stack 370-1 and may be vertically above lower dielectric stack 370-1 and vertically below upper dielectric stack 370-2. In some examples, the upper portion of control gate 355 may be adjacent to and may be lateral to (e.g., in the y-direction) upper dielectric stack 370-2, and the lower portion of control gate 355 may be adjacent to and may be lateral to (e.g., in the y-direction) lower dielectric stack 370-1.

The remainder of region 304, other than memory cells 300-1 and 300-2 and conductor 330, may be a dielectric 365, such as an oxide. For example, dielectric 365 might electrical isolate memory cell 330-1 from memory cell 300-2 and memory cells 300-1 and 300-2 from conductor 330. Note that conductor 330 may be between and may be lateral to control gates 355, for example.

In some examples, lower dielectric stack 370-1 and upper dielectric stack 370-2 may be to store a charge and may include the dielectric stack 224 (e.g., as discussed above in conjunction with FIGS. 2B, 2D, and 2E and Table 1, for an L3-level memory cell, and FIG. 2B and Table 2 for an L4-level memory cell). In other examples, lower dielectric stack 370-1 and upper dielectric stack 370-2 may include the dielectric stack 252 (e.g., discussed above in conjunction with FIG. 2C and Table 3 for an L5-level memory cell). In some examples, dielectric 364 might be might be an extension of the blocking dielectric 218 of dielectric stack 224 (FIG. 2B) or dielectric stack 252 (FIG. 2C).

In some examples, an upper dielectric stack 370-2 may extend laterally in the y-direction from a vertical side 311 to the upper portion of a control gate 355, and thus be laterally between vertical side 311 and the upper portion of a control gate 355, and a lower dielectric stack 370-1 may extend laterally in the y-direction from a vertical side 311 to the lower portion of a control gate 355, and thus be laterally between vertical side 311 and the lower portion of a control gate 355. For example, for dielectric stack 224, interface dielectric 214, such as an interface tunnel dielectric, may be adjacent to (e.g., and lateral to) a vertical side 311 and, for example, may be in direct physical contact with a vertical side 311; storage dielectric 226 may be adjacent to (e.g., and lateral to) interface dielectric 214; tunnel dielectric 227 may be adjacent to (e.g., and lateral to) storage dielectric 226; charge trap 228 may be adjacent to (e.g., and lateral to) tunnel dielectric 227; storage dielectric 230 may be adjacent to (e.g., and lateral to) charge trap 228; and blocking dielectric 218 may be adjacent to (e.g., and lateral to) storage dielectric 230. Interface metallic 220 may be adjacent to (e.g., and lateral to) blocking dielectric 218, and thus dielectric stack 224. For the upper dielectric stack 370-2, an upper portion of a control gate 355 may be adjacent to (e.g., and lateral to) interface metallic 220 and, for example, may be in direct physical contact with interface metallic 220. For the lower dielectric stack 370-1, a lower portion of a control gate 355 may be adjacent to (e.g., and lateral to) interface metallic 220 and, for example, may be in direct physical contact with interface metallic 220. Note, for example, that an interface metallic 220 may be between the lower dielectric stack 370-1 and the lower portion of a control gate 355, and an interface metallic 220 may be between the upper dielectric stack 370-2 and the upper portion of a control gate 355.

For dielectric stack 252, for example, interface dielectric 214 may be adjacent to (e.g., and lateral to) a vertical side 311 and, for example, may be in direct physical contact with a vertical side 311, storage dielectric 226 may be adjacent to (e.g., and lateral to) interface dielectric 214; tunnel dielectric 227 may be adjacent to (e.g., and lateral to) storage dielectric 226; charge trap 228 may be adjacent to (e.g., and lateral to) tunnel dielectric 227; storage dielectric 230 may be adjacent to (e.g., and lateral to) charge trap 228; blocking dielectric 255 may be adjacent to (e.g., and lateral to) storage dielectric 230; and blocking dielectric 218 may be adjacent to (e.g., and lateral to) blocking dielectric 255. Interface metallic 220 may be adjacent to (e.g., and lateral to) blocking dielectric 218, and thus dielectric stack 252. For the upper dielectric stack 370-2, an upper portion of a control gate 355 may be adjacent to (e.g., and lateral to) interface metallic 220 and, for example, may be in direct physical contact with interface metallic 220. For the lower dielectric stack 370-1, a lower portion of a control gate 355 may be adjacent to (e.g., and lateral to) interface metallic 220 and, for example, may be in direct physical contact with interface metallic 220.

In some examples, for dielectric stack 252, a blocking dielectric may be adjacent to (e.g., and lateral to) storage dielectric 230, and interface metallic 220 may be adjacent to (e.g., and lateral to) that blocking dielectric, where that blocking dielectric may include either blocking dielectric 255 adjacent to (e.g., and lateral to) storage dielectric 230 and blocking dielectric 218 adjacent to (e.g., and lateral to) blocking dielectric 255 or blocking dielectric 218 adjacent to (e.g., and lateral to) storage dielectric 230 and blocking dielectric 255 adjacent to (e.g., and lateral to) blocking dielectric 218.

A memory cell 300, for example, may operate as an L3-level memory cell (e.g., an L3-level USUM memory cell), when the dielectric stack 224 is as described above for an L3-level memory cell, and thus may replace an DRAM memory cell. For example, memory array 301 might be an L3-level memory array. A memory cell 300, for example, may operate as an L4-level memory cell (e.g., an L4-level USUM memory cell) when the dielectric stack 224 is as described above for an L4-level memory cell, and thus may replace a conventional NROM non-volatile memory cell or a conventional NAND non-volatile memory cell. For example, memory array 301 might be an L4-level memory array. A memory cell 300, for example, may operate as an L5-level memory cell (e.g., an L5-level USUM memory cell) when the dielectric stack 252 is as described above for an L5-level memory cell, and thus may be used in a memory array that may replace a conventional HDD. For example, memory array 301 might be an L5-level memory array. In some examples, an integration scheme similar to (e.g., the same as) that discussed above for the L3-, L4-, and L5-level memory cells and the L3-, L4-, and L5-level memory arrays in conjunction with FIGS. 2B and 2C might be employed to integrate L3-, L4-, and L5-level memory arrays 301.

In some examples, the access gate 350 and the gate dielectric 362 may form a fixed-threshold-voltage (Vt) portion (e.g., to within routine variations of the threshold voltage) of a memory cell 300 (e.g., memory cell 300-1 or memory cell 300-2) with a single Vt (e.g., to within routine variations of the Vt). There are two possibilities of charge storage and sensing of the memory cells depicted in FIG. 3A.

In some examples (e.g., for a first possibility of operation), a conductor 330 and the source/drain 316 coupled to that conductor 330 may be considered to function (e.g., only) as a common source, while the lines connecting source/drains 310-1 and 310-2 may be considered as independent data lines 325-1, 325-2, 325-3, etc. (FIG. 3B) and decoded with conventional decode logic. For example, contacts 335-1, 335-2, etc. may be coupled together outside the array and coupled, for example, to a ground potential. A data line 325 (e.g., any one of data lines 325-1 to 325-3) may be associated with memory cells 300-1 and 300-2 in a region 304 (such as a region 304-1 or 304-2 in FIG. 3B) and along successive regions 304-1 and 304-2 (e.g., in the y-direction, such as along a row of the memory array shown in FIG. 3B). For the first possibility, for example, the programmed memory state for either memory cell 300-1 or 300-2 may be determined by the amount of charge stored in the lower dielectric stack 370-1 (e.g., over the source side of the device). For this possibility, a binary memory state may be established, for example, between the erased state defined by the fixed threshold for the access gate and a higher threshold state established by the charge stored for each of the memory cells 300-1 and 300-2 in their respective lower dielectric stacks 370-1. This may be a base line, for example, for storing one bit for each of the memory cells 300-1 and 300-2, thus providing two-bits of storage (e.g., only) for the memory cell configuration of FIG. 3A (e.g., providing a storage capacity of two bits per region 304 (e.g., only). This may be used for L2-L3 functionality, for example, since the operation of programming and sensing may be fastest.

In the first possibility, for example, the charge storage may be uniform along the charge trap. For example, the bit storage capacity for each memory cell for this base line may be one bit (e.g., for a single-level-storage (SLS) uniform storage scheme). The memory window, for example, may be (e.g., conventionally) defined by a bit value of zero (e.g., the erased state) and by a bit value of one (e.g., the written state). For multilevel storage operations, such as dual-level storage (DLS), (e.g., with a larger memory window as may be required for L3-L4 functionality), the bit capacity per memory cell may be doubled to two bits per memory cell by subdividing the memory window into four memory states (e.g., to obtain four bits per region 304 of storage capacity). With a still larger memory window, for example, eight memory states may be created within the memory window to extend the capacity to tri-level storage (TLS) operations (e.g., three bits per cell and thus six bits of storage capacity per region 304).

In other examples (e.g., for a second possibility of operation), for a memory cell 300-1 and a memory cell 300-2, the roles of a source/drain 310 (e.g., source/drain 310-1 and/or a source/drain 310-2) and the data line 325 (e.g., data line 325-1, 325-2, or 325-3) coupled thereto and a source/drain 316 and the conductor 330 (e.g., conductor 330-1 or 330-2) coupled thereto may be treated independently, for example, through appropriate decode logic and an appropriate memory sensing scheme so that their roles could be reversed during programming and sensing. In such examples, localized trapping of a source/drain 310 and a source/drain 316 for each of the memory cells 300-1 and 300-2 may be discriminated to define storage states. This may allow localized storage over each of a source/drain 310 and a source/drain 316 (e.g., in the upper dielectric stack 370-2 and the lower dielectric stack 370-1) for each of the memory cells 300-1 and 300-2 and the storage capacity per region 304 may be doubled compared to where charge is stored (e.g., only) in the lower dielectric stacks 370-1 for each of the memory cells 300-1 and 300-2. Examples of the second possibility are discussed in the following examples.

The upper portion of control gate 355, the upper dielectric stack 370-2, and an interface metallic 220 (e.g., laterally) between the upper portion of control gate 355 and the upper dielectric stack 370-2, for example, may form an upper non-volatile portion of memory cell 300 that may store one or more bits of data. The lower portion of control gate 355, the lower dielectric stack 370-1, and an interface metallic 220 (e.g., laterally) between the lower portion of control gate 355 and the lower dielectric stack 370-1, for example, may form a lower non-volatile portion of memory cell 300 that may store one or more bits of data. For example, the fixed Vt portion may be vertically between the upper and lower non-volatile portions. The lower dielectric stack 370-1 and upper dielectric stack 370-2, for example, may each be programmed to one of a plurality of states (e.g., data states), where each memory state corresponds to a different Vt level (e.g., Vt range corresponding to a Vt level due to statistical variation). The lower dielectric stack 370-1 may be to store either a different data state than upper dielectric stack 370-2 or to store the same data state as upper dielectric stack 370-2. Note, for example, that the upper and lower non-volatile portions may be adjacent to (e.g., and lateral to) a portion 309 of semiconductor 308, and thus a channel 332.

For example, the fixed-Vt portion and the non-volatile portions may be coupled in series between a source/drain 310 and source/drain 316 by a channel 332. For example, the fixed-Vt portion may operate as a transistor, such as a FET, and each of the non-volatile portions may operate as a non-volatile memory cell. For a memory cell 300 to conduct, for example, the fixed-Vt portion may need to be activated in response to a voltage applied to access gate 350 (e.g., causing the portion of channel 332 adjacent thereto and lateral thereto to conduct) and both non-volatile portions may need to be activated in response to a voltage applied to control gate 355 (e.g., causing the portions of channel 332 respectively adjacent thereto and lateral thereto to conduct).

In an example, the fixed Vt portion may establish a lowest memory state, such as an erase state, of a memory cell 300. For example, the fixed-Vt portion may establish a more stable data state (e.g., with a smaller Vt range) than conventional non-volatile memory cells, such as conventional NROM memory cells. For example, the fixed Vt portion may act to reduce the number of under and/or over erasures that may otherwise act to increase the Vt range of the erase state (e.g., thus the split-gate design results in a smaller erase Vt range and stability of the erase state of memory reference).

For the second possibility, for example, the number of data states, and thus the number of threshold voltage ranges, may, for example, be given by $2^n$, where n is the number of bits per the lower dielectric stack 370-1 and/or the upper dielectric stack 370-2. This means, for example, that each memory cell 300 may have an increased bit density and may store 2n bits, n bits for each dielectric stack. Note, for example, that the combination of memory cells 300-1 and 300-2 associated with common source/drain 316 can store 4n bits.

To store n=1 bit in each dielectric stack, for example, one of two binary data states (e.g., either erase state "0" or the written state "1") may be programmed in each dielectric stack, where one bit may correspond (e.g., may be assigned) to each binary data state. To store n=2 bits in each dielectric stack, for example, one of four data states (e.g., including the erase state) may be programmed in each dielectric stack. To store n=3 bits in each dielectric stack, for example, one of eight data states (e.g., including the erase state) may be programmed in each dielectric stack. To store n=4 bits in each dielectric stack, for example, one of 16 data states (e.g., including the erase state) may be programmed in each dielectric stack. Therefore, the number of memory states including the reference erase state required in any dielectric stack for n bit of storage would be equal to $2^n$ where n=1, for single level store (SLS); n=2, for double level store (DLS); n=3, for triple level store (TLS) etc.

The density of some memory arrays, for example, may be defined in the x-y plane and increased densities may be realized by scaling down feature sizes, such as memory cell features, in the x-y plane. However, as memory cells are scaled down to about below about 50 nanometers, for example, the channel length might decrease to a point where the thresholds for memory states become ill-defined and memory cells may become inoperable due to short channel effects adversely affecting both memory window and threshold margins required for sensing the memory states.

By forming memory cells 300 vertically, the device channel length may be long enough (e.g., in the z-direction) to reduce (e.g., eliminate) short channel effects (e.g., without increasing the density of the memory array). For example, memory array 301 may be scaled down to have about five nanometer feature sizes in the x-y plane (e.g., with little or no change in the channel length in the z-direction), thereby possibly avoiding short-channel effects.

The L2-L3-, L4-, and L5-level memory cells described above may be respectively in L2-L3, L4, and L5 memory arrays. For example, the L2-L3, L3, and L5 memory arrays discussed above in conjunction with memory array 301 may respectively be L3, L3, and L5 sub-arrays within a single virtual-ground array (VGA). Advantageously, in such an array, for example, sensing and programming schemes may be similar and data transfer to the processor may be parallel with higher band width. Unlike in conventional memory hierarchy designs, for example, data-transfer-induced latency to avoid conflicts in data transfer from conventional separate L3-, L4-, and L5-level arrays may be avoided, and thus the large number of "wait" clock cycles and the logic overhead delay and energy consumption associated with such conflicts may be reduced.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A memory cell, comprising:
   an access gate;
   a control gate coupled to the access gate;
   a first dielectric stack below an upper surface of a semiconductor, above the access gate, and between a first portion of the control gate and the semiconductor; and
   a second dielectric stack below the access gate and the first dielectric stack and between a second portion of the control gate and the semiconductor;
   wherein each of the first and second dielectric stacks is to store a charge;
   wherein the first dielectric stack and the second dielectric stack each comprise an interface dielectric lateral to the semiconductor, a tunnel dielectric lateral to the interface dielectric, a charge trap lateral to the tunnel dielectric, and a blocking dielectric lateral to the charge trap, and further comprising an interface metallic lateral to the blocking dielectric of each of the first dielectric stack and the second dielectric stack, wherein the first portion of the control gate is lateral to the interface metallic lateral to the blocking dielectric of the first dielectric stack and the second portion of the control gate is lateral to the interface metallic lateral to the blocking dielectric of the second dielectric stack; and
   wherein a first storage dielectric is laterally between the interface dielectric and the tunnel dielectric and a second storage dielectric is laterally between the charge trap and the blocking dielectric.

2. The memory cell of claim 1, further comprising an additional dielectric between the semiconductor and the access gate and between the first dielectric stack and the second dielectric stack.

3. The memory cell of claim 1, wherein the control gate is a single continuous structure.

4. The memory cell of claim 1, further comprising a first source/drain in the semiconductor and adjacent to the first dielectric stack and a second source/drain in the semiconductor and adjacent to the second dielectric stack.

5. The memory cell of claim 4, wherein the first source/drain is above the second source/drain.

6. The memory cell of claim 5, wherein an upper surface of the first source/drain is coplanar with the upper surface of the semiconductor.

7. The memory cell of claim 1, wherein the memory cell is a USUM memory cell.

8. The memory cell of claim 1, wherein the first dielectric stack and the second dielectric stack each further comprise a first storage dielectric between the interface dielectric and the tunnel dielectric and a second storage dielectric between the charge trap and the blocking dielectric.

9. The memory cell of claim 1, wherein the interface dielectric comprises OR—SiON, the first storage dielectric comprises i-SRN, the tunnel dielectric comprises HfSiON, the charge trap comprises GaN, the second storage dielectric comprises i-SRN, and the blocking dielectric comprises HfSiON or HfSiON and $AL_2O_3$.

10. A memory cell, comprising:
    a first source/drain;
    a second source/drain below an upper surface of a semiconductor and below the first source/drain;

a channel in the semiconductor between the first source/drain and the second source/drain;
a first non-volatile portion lateral to the channel and adjacent to the first source/drain;
a second non-volatile portion lateral to the channel, below the first non-volatile portion, and adjacent to the second source/drain; and
a gate between the first non-volatile portion and the second non-volatile portion and lateral to the channel;
wherein the gate is an access gate that is coupled to a control gate, and wherein the first non-volatile portion comprises a first dielectric stack and a first portion of the control gate coupled to the first dielectric stack and the second non-volatile portion comprises a second dielectric stack and a second portion of the control gate coupled to the second dielectric stack; and
wherein the first and second dielectric stacks each comprise an interface dielectric lateral to the channel, a first storage dielectric lateral to the interface dielectric, a tunnel dielectric lateral to the first storage dielectric, a charge trap lateral to the tunnel dielectric, a second storage dielectric lateral to the charge trap, and a blocking dielectric lateral to the second storage dielectric, wherein the first portion of the control gate is lateral to the blocking dielectric for the first dielectric stack and the second portion of the control gate is lateral to the blocking dielectric for the second dielectric stack.

11. The memory cell of claim 10, wherein the channel is to couple the first non-volatile portion and the second non-volatile portion in series between the first source/drain and the second source/drain.

12. The memory cell of claim 11, further comprising a fixed-threshold-voltage portion between the first non-volatile portion and the second non-volatile portion and that comprises the access gate, wherein the channel is to couple the fixed-threshold-voltage portion in series with the first non-volatile portion and the second non-volatile portion.

13. A memory array, comprising:
a first memory cell and a second memory cell in a region that extends below an upper surface of a semiconductor;
wherein the first memory cell and the second memory cell are respectively adjacent to respective portions of the semiconductor that respectively form sides of the region;
wherein each of the first and second memory cells comprises:
a control gate;
a first dielectric stack between a first portion of the control gate and the respective portion of the semiconductor, the first dielectric stack to store a charge;
a second dielectric stack below the first dielectric stack and between a second portion of the control gate and the respective portion of the semiconductor, the second dielectric stack to store a charge; and
an access gate coupled to the control gate and between the first dielectric stack and the second dielectric stack;
wherein the control gate is below the upper surface of the semiconductor and is coupled to a program line that is below the upper surface of the semiconductor, and wherein the access gate is below the upper surface of the semiconductor and is coupled to an access line that is below the upper surface of the semiconductor.

14. The memory array of claim 13, wherein the respective portion of the semiconductor to which the first memory cell is adjacent comprises a first source/drain of the first memory cell adjacent to the first dielectric stack of the first memory cell, wherein the respective portion of the semiconductor to which the second memory cell is adjacent comprises a first source/drain of the second memory cell adjacent to the first dielectric stack of the second memory cell, and further comprising a second source/drain common to the first and second memory cells and below the first source/drain of the first memory cell and below the first source/drain of the second memory cell.

15. The memory array of claim 14, wherein a first portion of the second source/drain forms a bottom of the region that extends below the upper surface of the semiconductor, wherein a second portion of the second source/drain extends into the respective portion of the semiconductor to which the first memory cell is adjacent and is adjacent to the second dielectric stack of the first memory cell, and wherein a third portion of the second source/drain extends into the respective portion of the semiconductor to which the second memory cell is adjacent and is adjacent to the second dielectric stack of the second memory cell.

16. The memory array of claim 14, wherein an upper surface of the first source/drain of the first memory cell and an upper surface of the first source/drain of the second memory cell are coplanar with the upper surface of the semiconductor, and wherein a data line is above the upper surface of the semiconductor and is coupled to the upper surface of the first source/drain of the first memory cell and to the upper surface of the first source/drain of the second memory cell.

17. The memory array of claim 14, further comprising a conductor laterally between the first and second memory cells in the region that extends below the upper surface of the semiconductor, wherein the conductor is coupled to the second source/drain, and wherein the conductor is below the upper surface of the semiconductor and is connected to a contact outside of the memory array.

18. A memory array, comprising:
a first memory cell and a second memory cell in a region that extends below an upper surface of a semiconductor;
wherein the first memory cell and the second memory cell are respectively adjacent to respective portions of the semiconductor, wherein the respective portions of the semiconductor respectively comprise respective sidewalls that respectively form sides of the region;
a control gate;
a first dielectric stack between a first portion of the control gate and the respective portion of the semiconductor, the first dielectric stack to store a charge;
a second dielectric stack below the first dielectric stack and between a second portion of the control gate and the respective portion of the semiconductor, the second dielectric stack to store a charge; and
an access gate coupled to the control gate and between the first dielectric stack and the second dielectric stack;
wherein the respective portion of the semiconductor to which the first memory cell is adjacent comprises a first source/drain of the first memory cell adjacent to the first dielectric stack of the first memory cell, wherein the respective portion of the semiconductor to which the second memory cell is adjacent comprises a first source/drain of the second memory cell adjacent to the first dielectric stack of the second memory cell, and further comprising a second source/drain common to the first and second memory cells and below the first source/drain of the first memory cell and below the first source/drain of the second memory cell; and a conductor laterally between the first and second memory cells in the region that extends below the upper surface of the semiconductor, wherein the conductor is coupled to the second source/drain, and wherein the conductor is below the upper surface of the semiconductor and is connected to a contact outside of the memory array.

* * * * *